(12) United States Patent
Imai et al.

(10) Patent No.: US 10,928,469 B2
(45) Date of Patent: Feb. 23, 2021

(54) MAGNETIC RESONANCE IMAGING APPARATUS

(71) Applicant: CANON MEDICAL SYSTEMS CORPORATION, Otawara (JP)

(72) Inventors: Satoshi Imai, Nasushiobara (JP);
Sadanori Tomiha, Nasushiobara (JP);
Keiichiro Ishi, Nasushiobara (JP);
Takaya Mori, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 80 days.

(21) Appl. No.: 15/967,793

(22) Filed: May 1, 2018

(65) Prior Publication Data
US 2018/0329004 A1 Nov. 15, 2018

(30) Foreign Application Priority Data
May 12, 2017 (JP) .............................. JP2017-095375

(51) Int. Cl.
*G01R 33/36* (2006.01)
*G01R 33/54* (2006.01)
*G01R 33/483* (2006.01)
*G01R 33/58* (2006.01)

(52) U.S. Cl.
CPC ..... *G01R 33/3607* (2013.01); *G01R 33/4833* (2013.01); *G01R 33/543* (2013.01); *G01R 33/583* (2013.01)

(58) Field of Classification Search
CPC .... G01R 33/36; G01R 33/365; G01R 33/583; G01R 33/483; G01R 33/4833; G01R 33/543
See application file for complete search history.

(56) References Cited

U.S. PATENT DOCUMENTS

2011/0101980 A1\* 5/2011 Ohiwa ............... G01R 33/4833
324/309

FOREIGN PATENT DOCUMENTS

JP        11-309128        11/1999

\* cited by examiner

*Primary Examiner* — Son T Le
(74) *Attorney, Agent, or Firm* — Oblon, McClelland, Maier & Neustadt, L.L.P.

(57) ABSTRACT

A magnetic resonance imaging apparatus according to an embodiment includes a transmission coil and processing circuitry. The transmission coil is configured to apply a high frequency magnetic field to an object. The processing circuitry is configured to: derive, based on at least one of an imaging region and the body shape data of the object, a specific area in a field of view (FOV); and determine, based on a signal within the specific area, an output power level of a high frequency pulse signal supplied to the transmission coil.

18 Claims, 18 Drawing Sheets

MAGNETIC RESONANCE IMAGING APPARATUS

CROSS-REFERENCE TO RELATED APPLICATION

This application is based upon and claims the benefit of priority from Japanese Patent Application No. 2017-095375, filed on May 12, 2017, the entire contents of which are incorporated herein by reference.

FIELD

An embodiment as an aspect of the present invention relates to a magnetic resonance imaging (MRI) apparatus.

BACKGROUND

The MRI apparatus performs an imaging of an object placed on a table, and acquires internal data of the object as image data.

The MRI apparatus includes a transmission coil, such as a whole body (WB) coil, for transmitting high frequency pulses, that is, radio frequency (RF) pulses. The WB coil receives RF pulse signals from an RF transmitter, and excites atomic nuclear spins of an imaging region placed in the static magnetic field with high frequency pulses of Larmor frequency, that is, the RF pulses. Then, the MRI apparatus receives magnetic resonance signals, that is, MR signals generated from the imaging region with the excitation by a reception coil, for example a local coil, and generates the image data based on the MR signals.

When detecting the MR signal from the object by, for example, a spin echo sequence, the MRI apparatus transmits an RF pulse (hereinafter referred to as "90° pulse") for providing a flip angle of 90° and an RF pulse (hereinafter referred to as "180° pulse") for providing a flip angle of 180° from the transmission coil to the object. In this case, unless an accurate 90° pulse or 180° pulse is applied, the reception coil cannot acquire the MR signal having the maximum intensity.

Therefore, in a pre-scan, the MRI apparatus executes multiple spin echo sequences having different output power levels (hereinafter referred to as "RF levels") of the RF pulse signal supplied to the transmission coil while changing the gain of the RF transmitter, and thereby acquiring the MR signals, respectively. Then, the MRI apparatus determines an RF level corresponding to the maximum MR signal, as the RF level corresponding to the 90° pulse or the 180° pulse.

In the pre-scan, the MRI apparatus determines the RF level corresponding to the 90° pulse based on all the MR signals in a field of view (FOV). For example, when the pre-scan is performed on an abdomen as the imaging region, the MRI apparatus determines the RF level corresponding to the 90° pulse based on the average value of all the MR signals in the FOV. In this case, the RF level corresponding to the 90° pulse is determined in accordance with the MR signal of the entire FOV, even if the MR signal of the spinal area that is the region of interest is low.

BRIEF DESCRIPTION OF THE DRAWINGS

In accompanying drawings.

Figure 4:
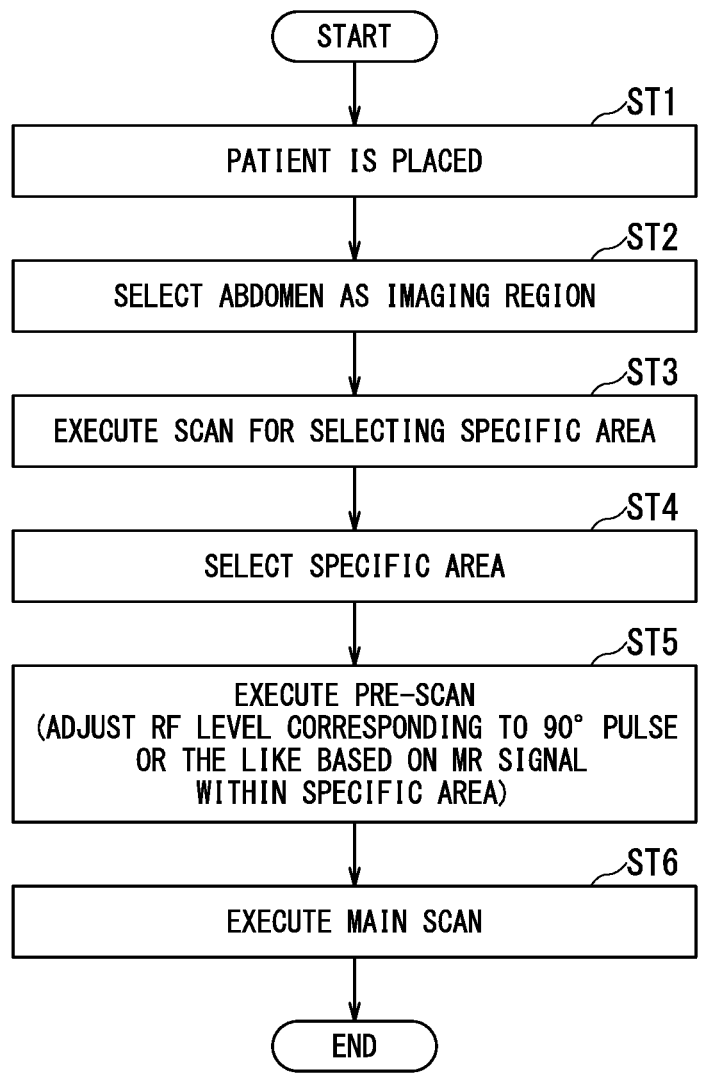
FIG. 4 is a flowchart showing an operation of the MRI apparatus according to the embodiment in a case where the abdomen is set as an imaging region.
Figure 5C:
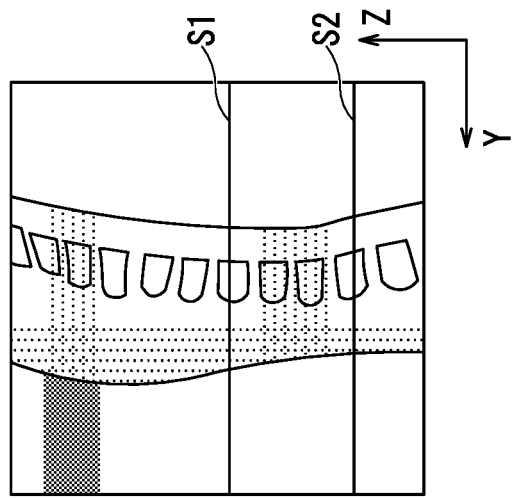
Figure 5B:
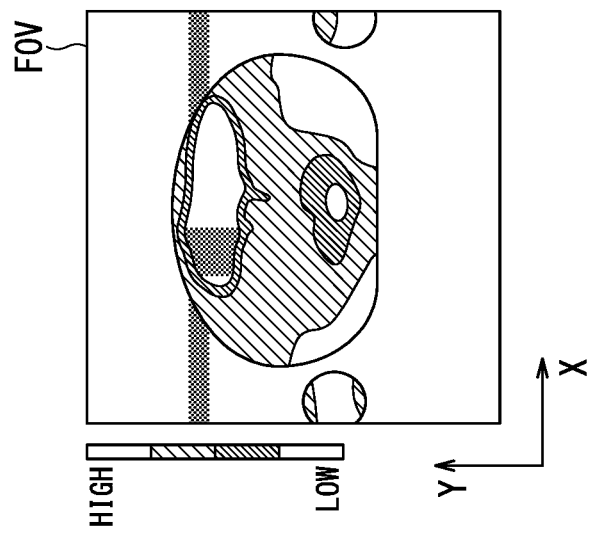
Figure 5A:
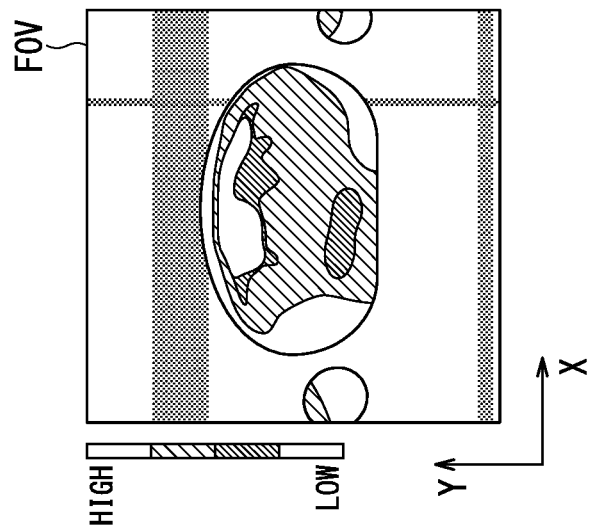
Figure 6C:
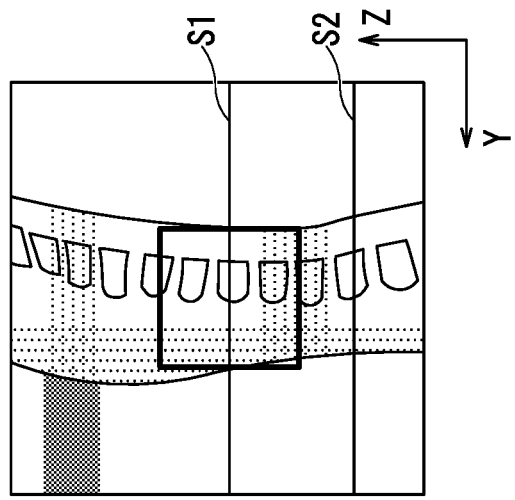
Figure 6B:
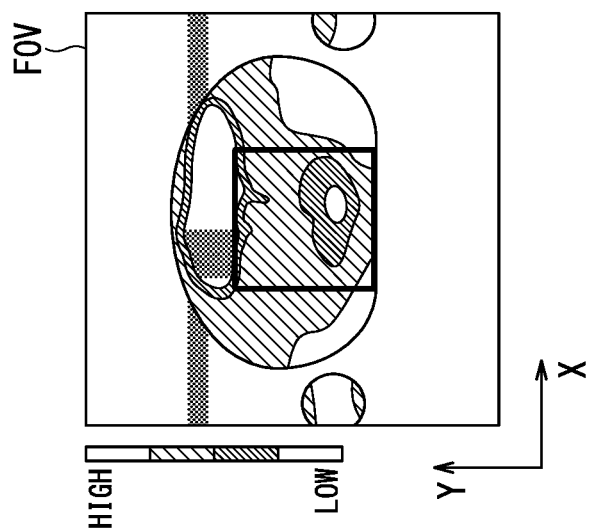
Figure 6A:
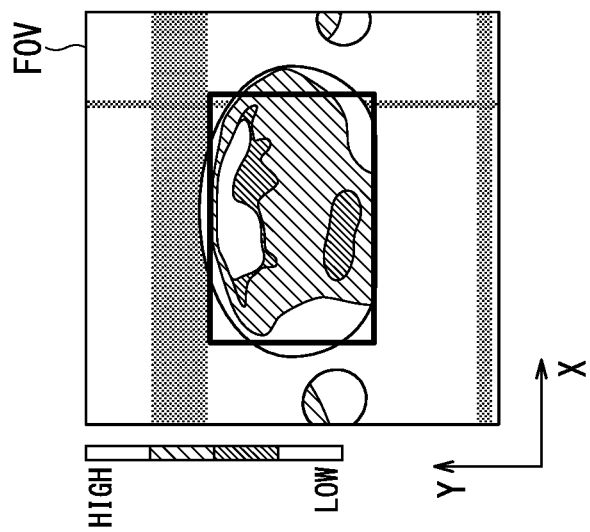
Figure 7:
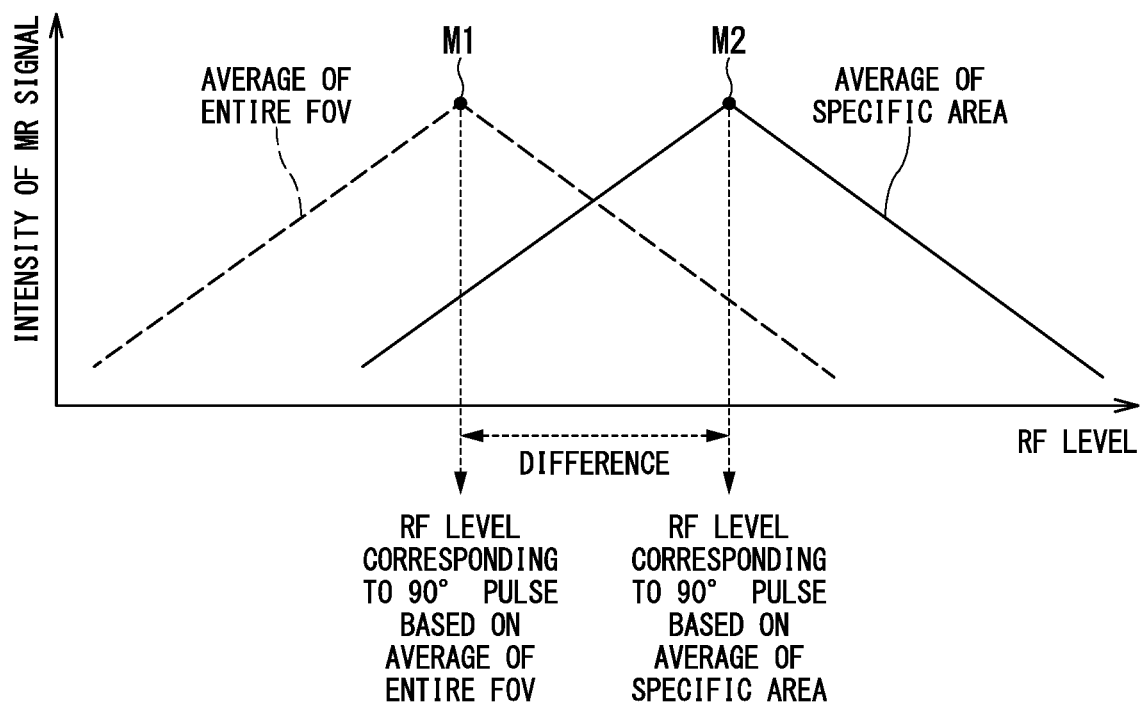
Figure 8:
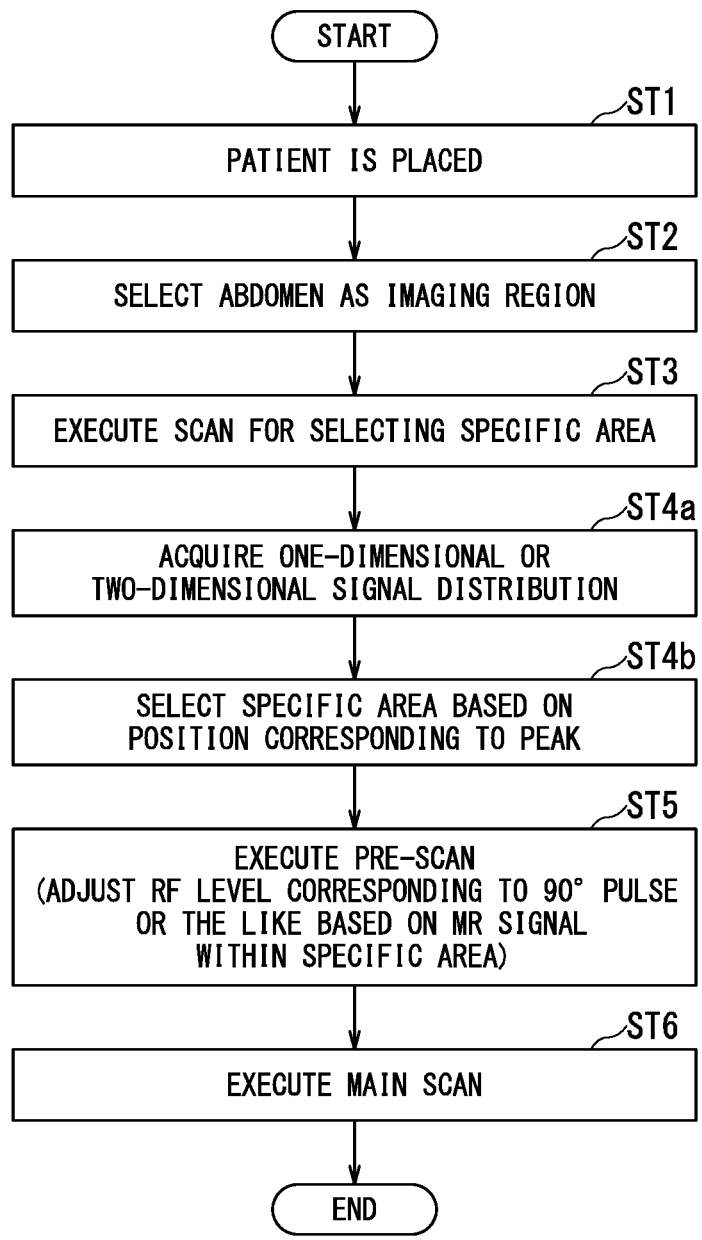
Figure 9A:
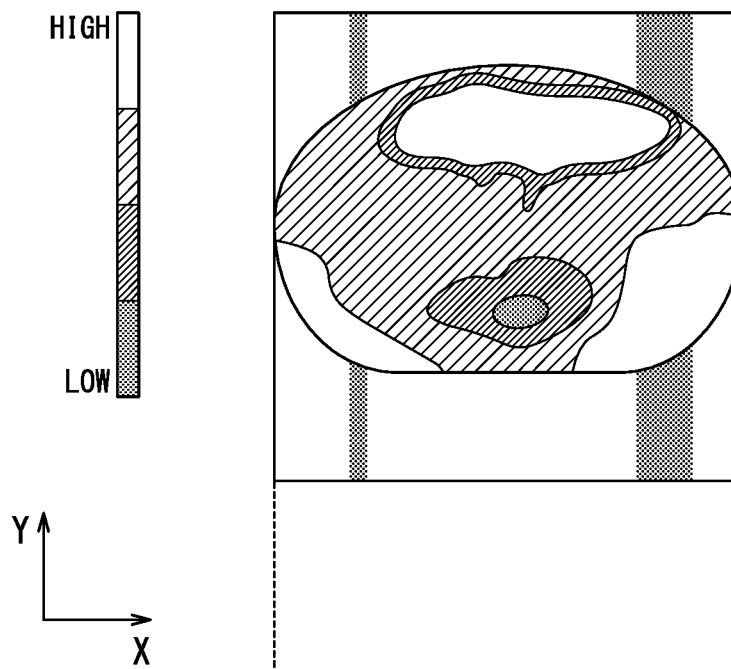
Figure 9B:
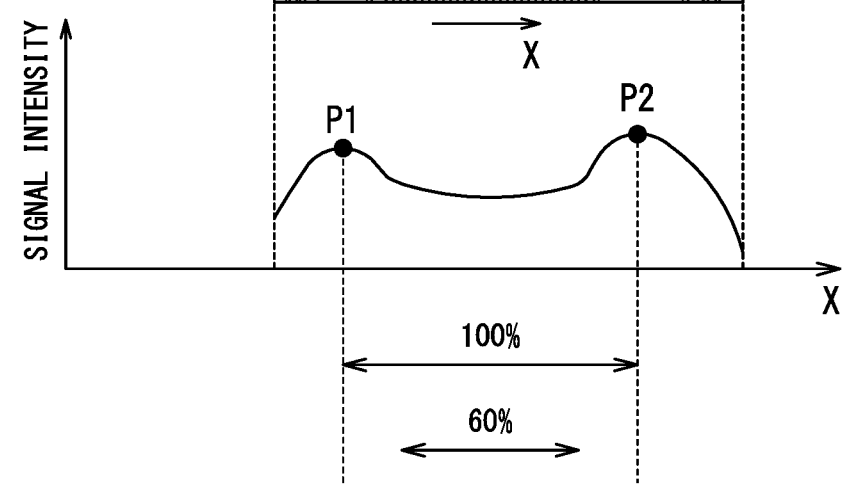
Figure 10:
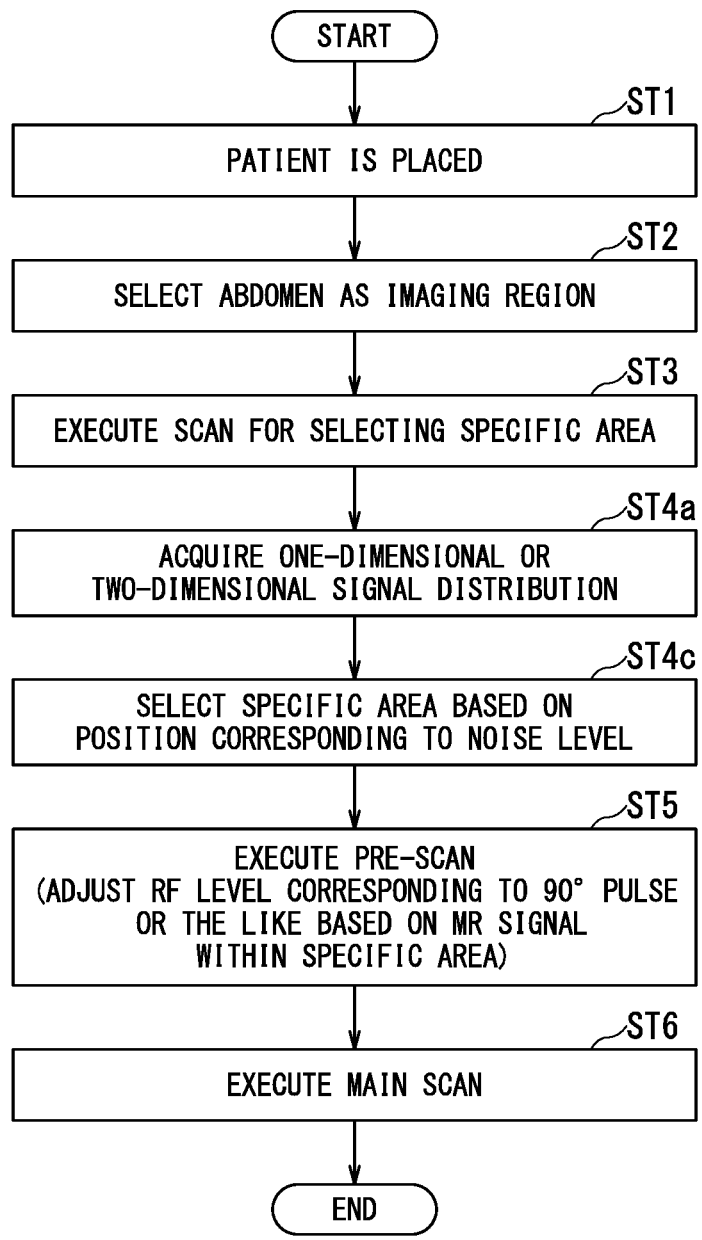
Figure 11A:
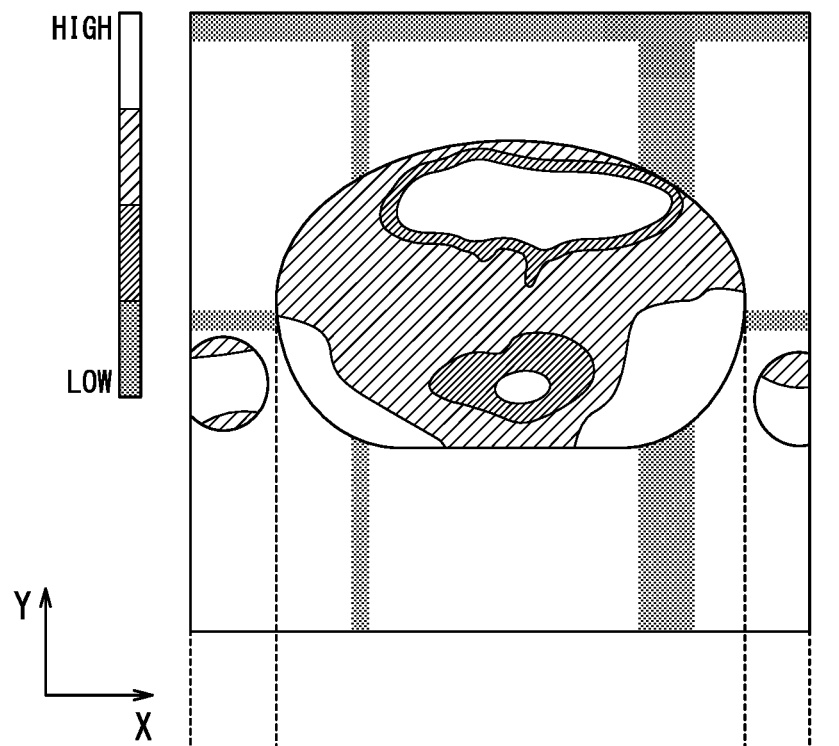
Figure 11B:
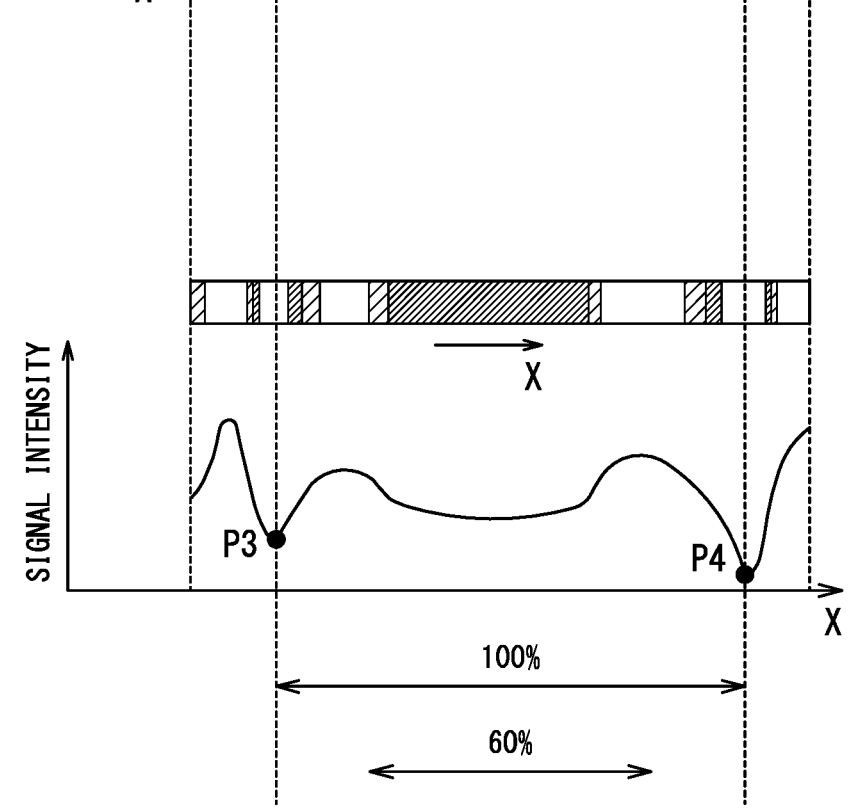
Figure 12:
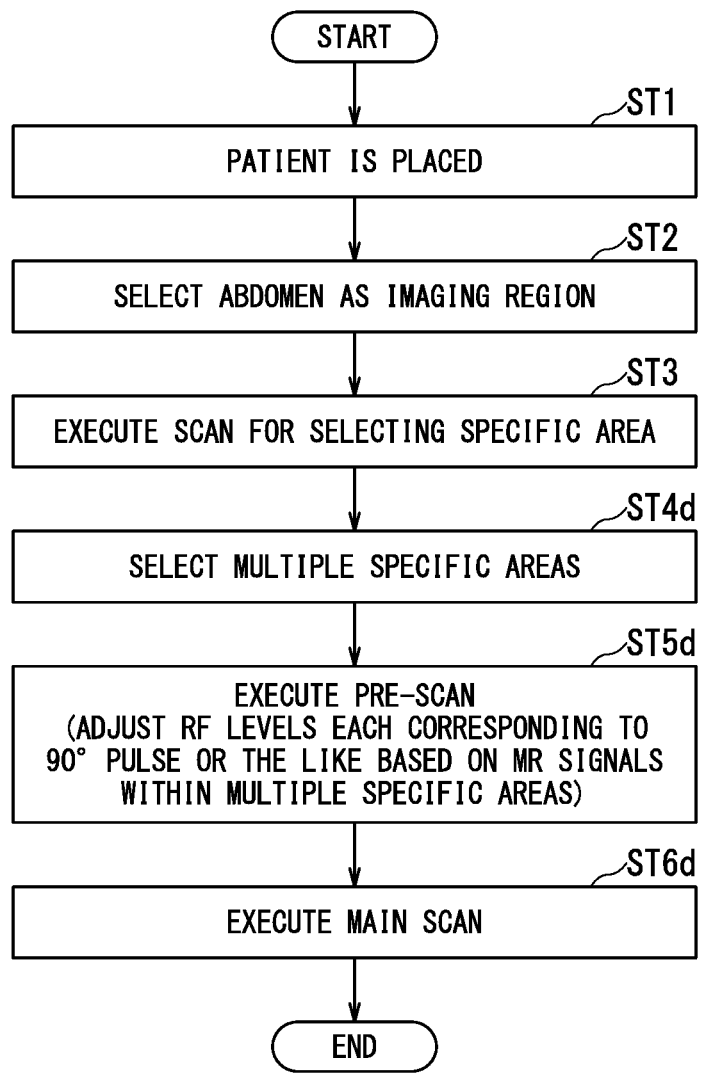
Figure 13:
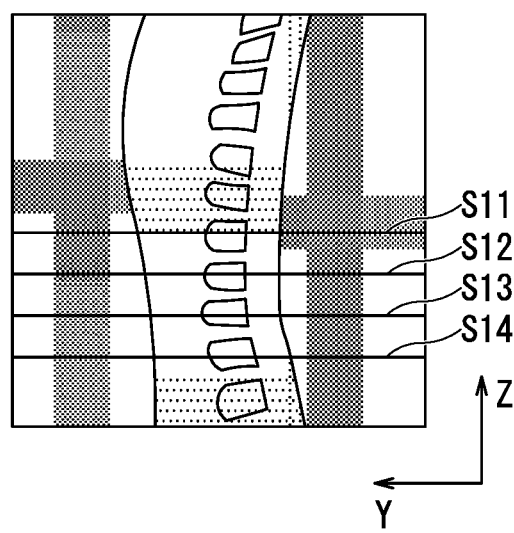
Figure 14:
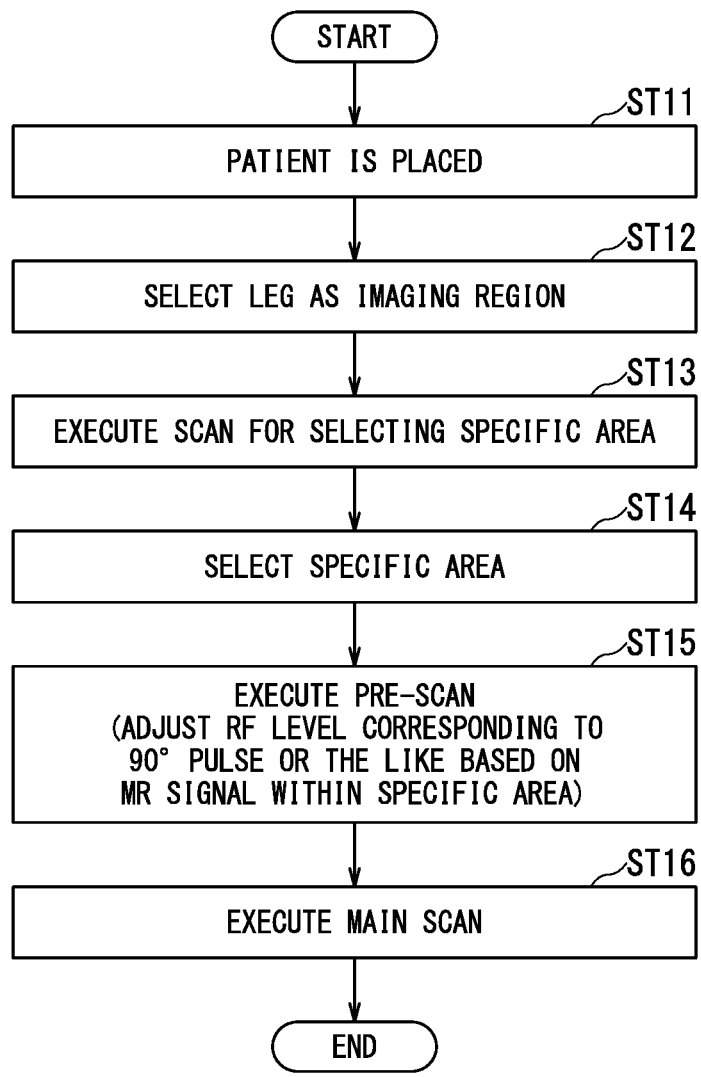
Figure 15:
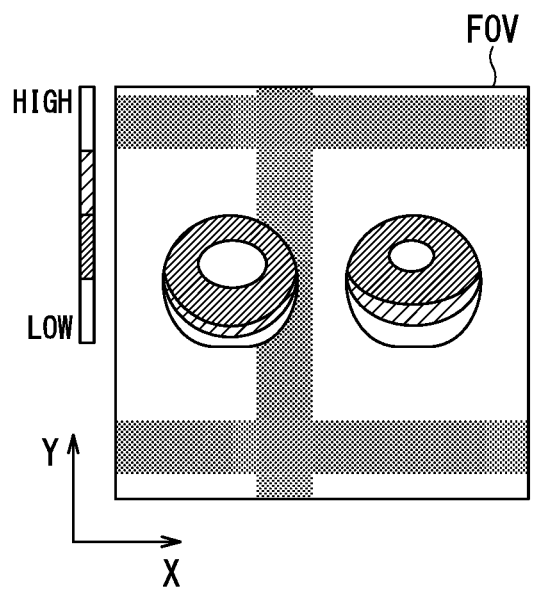
Figure 16:
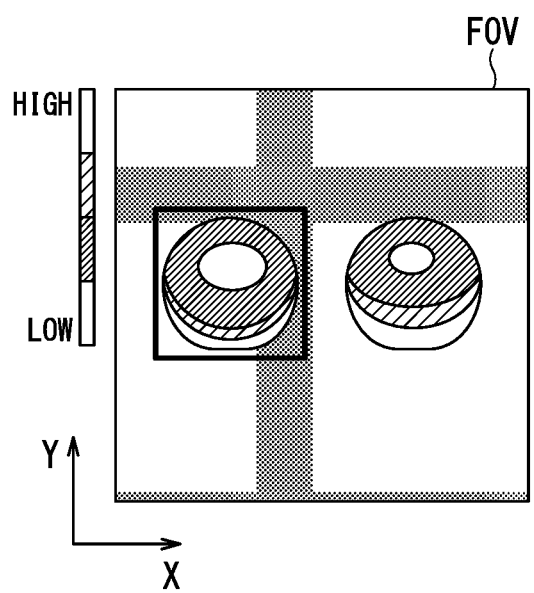
Figure 17:
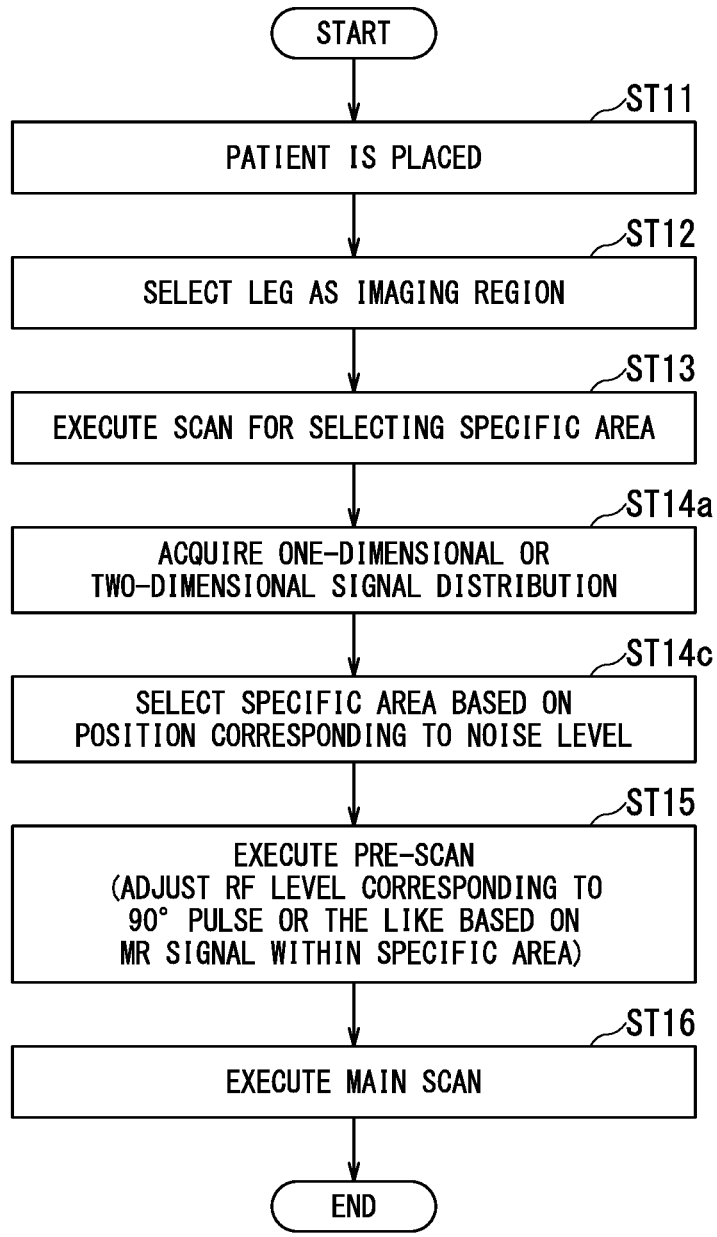
Figure 18A:
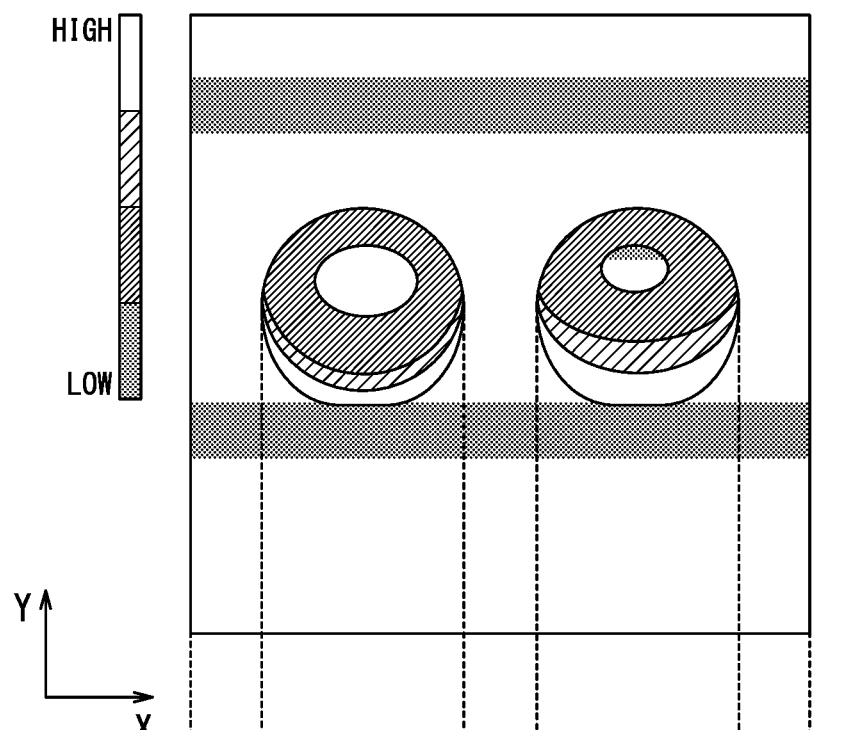
Figure 18B:
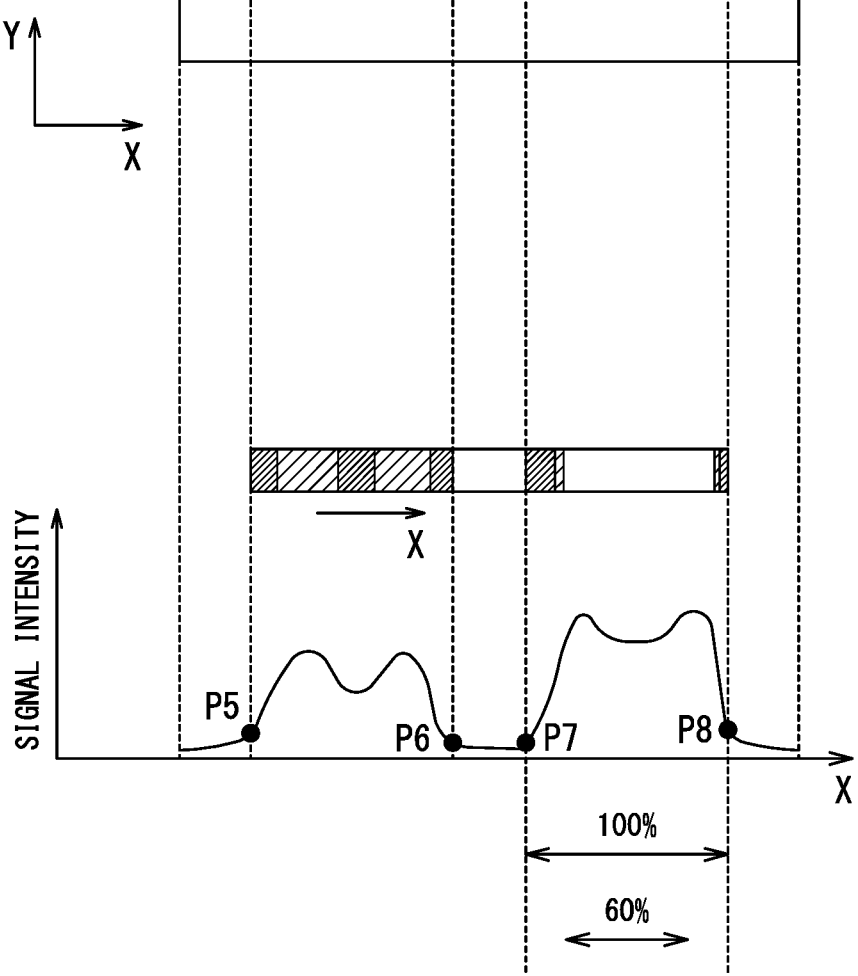
Figure 19A:
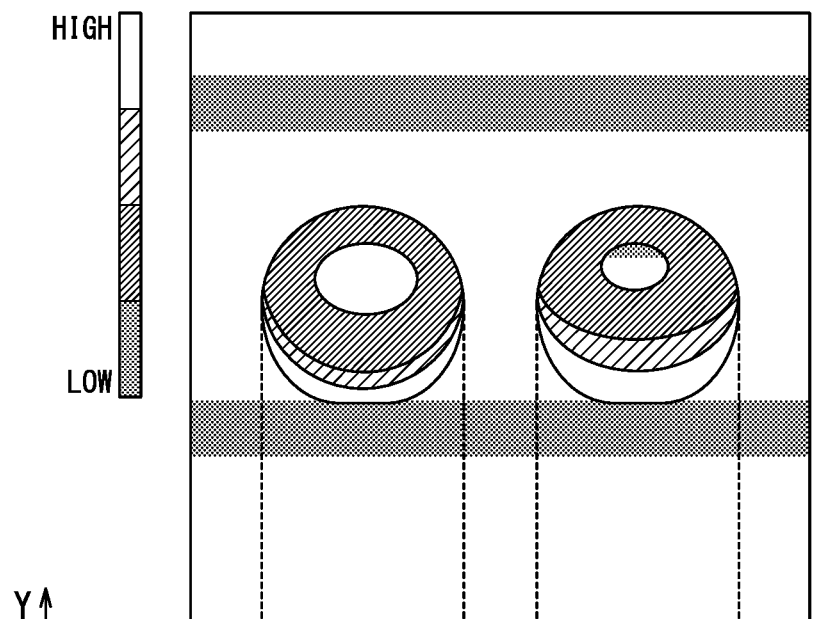
Figure 19B:
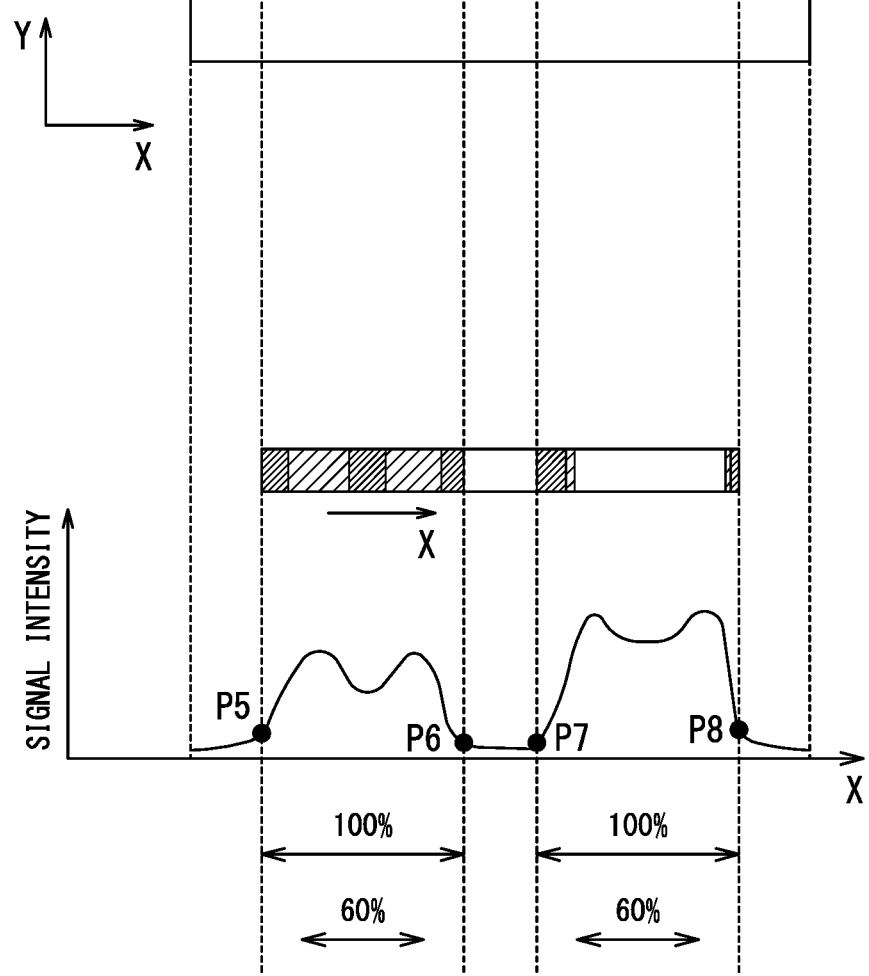

Each of FIGS. 5A to 5C is a diagram showing a two-dimensional signal distribution in an FOV including a lumbar area in the MRI apparatus according to the embodiment;

Each of FIGS. 6A to 6C is a diagram showing two-dimensional signal distribution and a specific area in an FOV including a lumbar area in the MRI apparatus according to the embodiment;

FIG. 7 is a diagram for explaining, by contrast using a graph: a method of determining an RF level corresponding to the 90° pulse based on the MR signal of the entire FOV including the lumbar region; and a method of determining an RF level corresponding to the 90° pulse based on MR signals within the specific area selected in the MRI apparatus according to the embodiment;

FIG. 8 is a flowchart showing a first specific example of the operation of the MRI apparatus according to the embodiment shown in FIG. 4;

FIG. 9A is a diagram showing a two-dimensional signal distribution in the FOV including the lumbar area in the MRI apparatus according to the embodiment;

FIG. 9B is a diagram showing a one-dimensional signal distribution in the FOV including the lumbar area in the MRI apparatus according to the embodiment;

FIG. 10 is a flowchart showing a second specific example of the operation of the MRI apparatus according to the embodiment shown in FIG. 4;

FIG. 11A is a diagram showing a two-dimensional signal distribution in the FOV including the lumbar area in the MRI apparatus according to the embodiment;

FIG. 11B is a diagram showing a one-dimensional signal distribution in the FOV including the lumbar area in the MRI apparatus according to the embodiment;

FIG. 12 is a flowchart showing a third specific example of the operation of the MRI apparatus according to the embodiment shown in FIG. 4;

FIG. 13 is a diagram showing multiple slices including a lumbar area in the MRI apparatus according to the embodiment;

FIG. 14 is a flowchart showing an operation of the MRI apparatus according to the embodiment in a case where the leg is set as an imaging region;

FIG. 15 is a diagram showing a two-dimensional signal distribution in the FOV including both legs area in the MRI apparatus according to the embodiment;

FIG. 16 is a diagram showing a two-dimensional signal distribution and a specific area in the FOV including the both legs area in the MRI apparatus according to the embodiment;

FIG. 17 is a flowchart showing a first specific example of an operation of the MRI apparatus according to the embodiment shown in FIG. 14;

FIG. 18A is a diagram showing a two-dimensional signal distribution in the FOV including the legs area in the MRI apparatus according to the embodiment;

FIG. 18B is a diagram showing a one-dimensional signal distribution in the FOV including the legs area in the MRI apparatus according to the embodiment;

FIG. 19A is a diagram showing a two-dimensional signal distribution in the FOV including the legs area in the MRI apparatus according to the embodiment; and FIG. 19B is a diagram showing a one-dimensional signal distribution in the FOV including the legs area in the MRI apparatus according to the embodiment.

DETAILED DESCRIPTION

An embodiment of the present invention will be described below with reference to the accompanying drawings.

A magnetic resonance imaging apparatus according to an embodiment includes a transmission coil and processing circuitry. The transmission coil is configured to apply a high frequency magnetic field to an object. The processing circuitry is configured to: derive, based on at least one of an imaging region and the body shape data of the object, a specific area in a field of view (FOV); and determine, based on a signal within the specific area, an output power level of a high frequency pulse signal supplied to the transmission coil.

Figure 1:
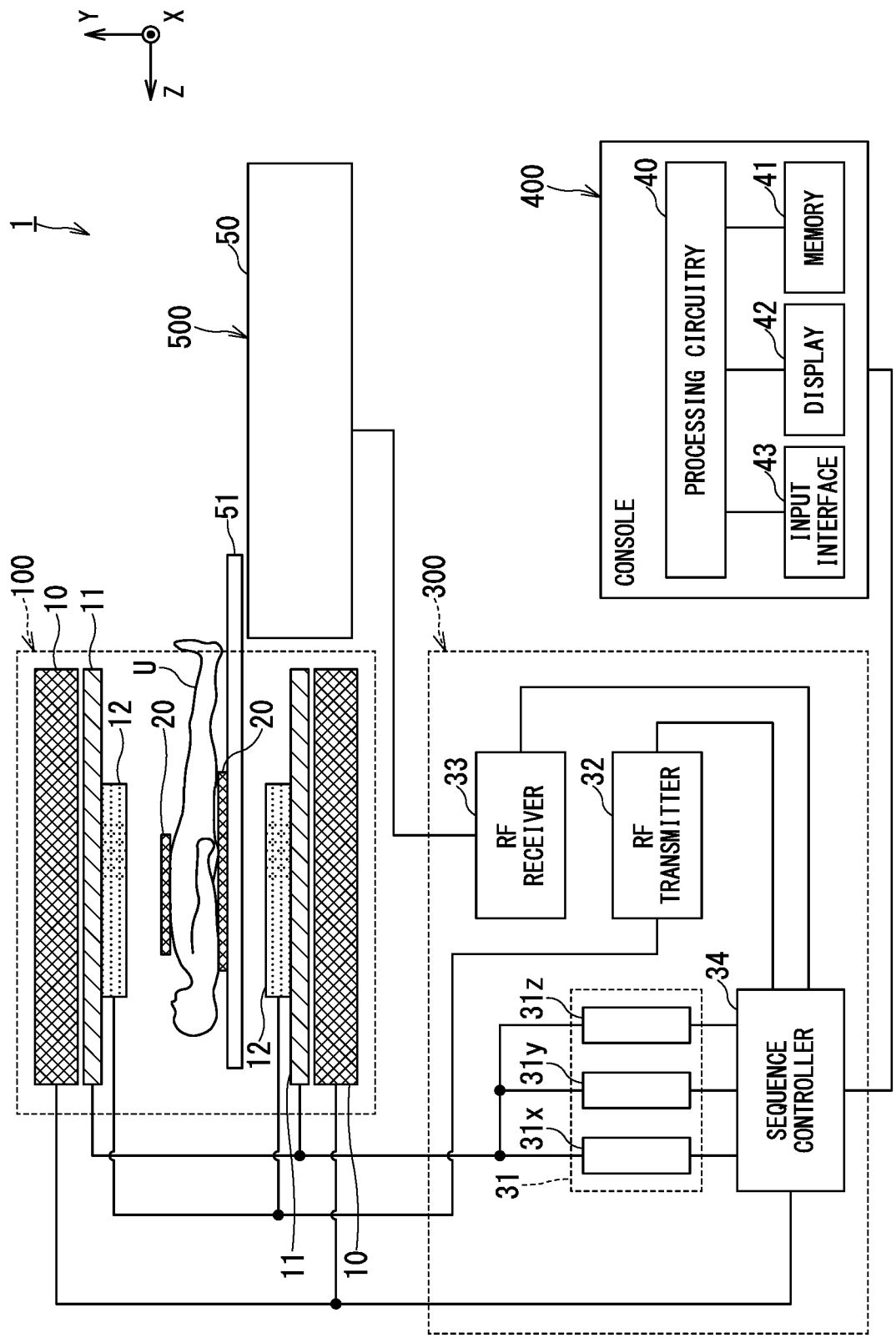
FIG. 1 is a schematic diagram showing entire constitution of an MRI apparatus according to an embodiment.

FIG. 1 is a schematic diagram showing entire constitution of an MRI apparatus 1 according to an embodiment.

FIG. 1 shows an MRI apparatus 1 according to the embodiment. The MRI apparatus 1 includes a magnet rack 100, a control cabinet 300, a console 400, and a bed 500. The magnet rack 100, the control cabinet 300, and the bed 500 are generally provided in an examination room. The examination room is also called the imaging room. The console 400 is provided in a control room. The control room is also called an operation room.

The magnet rack 100 has a static magnetic field magnet 10, a gradient magnetic field coil 11, and a WB coil 12. These components are accommodated in a housing having cylindrical shape. The bed 500 has a bed body 50 and a table 51.

The control cabinet 300 includes a gradient magnetic field power supply 31 (for X-axis 31x, for Y-axis 31y, and for Z-axis 31z), an RF transmitter 32, an RF receiver 33, and a sequence controller 34.

The console 400 includes processing circuitry 40, a memory 41, a display 42, and an input interface 43. The console 400 functions as a host computer.

The static magnetic field magnet 10 of the magnet rack 100 is roughly divided into a tunnel type and an open type. In the tunnel type, the magnet has a cylindrical magnet structure. In the open type, a pair of magnets is arranged above and below the imaging space. In the embodiment, the case where the static magnetic field magnet 10 is the tunnel type will be described, but the present invention is not limited to that case.

The static magnetic field magnet 10 has a substantially cylindrical shape and generates a static magnetic field in a bore into which an object or a patient U, for example, is conveyed. The bore is a space inside a cylinder of the magnet rack 100. The static magnetic field magnet 10 is, for example, composed of: a casing for holding liquid helium; a refrigerator for cooling the liquid helium to an extremely low temperature; and a superconducting coil inside the casing. It should be noted that the static magnetic field magnet 10 may be constituted by a normal conductive magnet or a permanent magnet. Hereinafter, the case where the static magnetic field magnet 10 has the superconducting coil will be described.

The static magnetic field magnet 10 incorporates the superconductive coil, and the superconductive coil is cooled to the extremely low temperature by the liquid helium. The static magnetic field magnet 10 generates a static magnetic field by applying a current supplied from a power supply device for the static magnetic field in an excitation mode to the superconductive coil. After that, when the mode changes to a permanent current mode, the power supply device for the static magnetic field is separated. Once the mode has changed to the permanent current mode, the static magnetic field magnet 10 continues to generate the static magnetic field over a long period of time, for 1 year or more, for example.

The gradient magnetic field coil 11 has a substantially cylindrical shape similarly to the static magnetic field magnet 10 and is installed inside the static magnetic field magnet 10. The gradient magnetic field coil 11 applies a gradient magnetic field to the patient U by electric power supplied from the gradient magnetic field power supply 31.

In this embodiment, since an eddy current generated with the generation of the gradient magnetic field interferes with imaging, an actively shielded gradient coil (ASGC) with a purpose of reduction of the eddy current may be used as the gradient magnetic field coil 11, for example. The ASGC is a gradient magnetic field coil in which a shield coil for minimizing effect of leakage current is provided on an outer side of a main coil for forming gradient magnetic fields in the X-axis, Y-axis, and Z-axis directions, respectively.

The WB coil 12 is installed substantially in a cylindrical shape so as to surround the patient U on an inner side of the gradient magnetic field coil 11. The WB coil 12 functions as a transmission coil. That is, the WB coil 12 transmits an RF pulse toward the patient U according to an RF pulse signal transmitted from the RF transmitter 32. On the other hand, the WB coil 12 may function as a reception coil in addition to function as the transmission coil. In this case, the WB coil 12 receives an MR signal emitted from the patient U by excitation of a nucleus.

The MRI apparatus 1 may include a local coil 20 as shown in FIG. 1 in addition to the WB coil 12. The local coil 20 is placed in the vicinity of a body surface of the patient U. The local coil 20 may include coil elements. These coil elements are arranged on an array and inside the local coil 20, and are called PAC (Phased Array Coil) in some cases.

The local coil 20 has several types. For example, the local coil 20 has types such as a body coil installed at a chest part, a belly part or a leg part of the patient U as shown in FIG. 1, and a spine coil installed on a back side of the patient U and the like. Besides, the local coil 20 has types such as a head coil for imaging a head part of the patient U and a foot coil for imaging a foot and the like. Moreover, the local coil 20 has types such as a wrist coil for imaging a wrist, a knee coil for imaging a knee, a shoulder coil for imaging a shoulder and the like.

The local coil 20 functions as the reception coil. That is, the local coil 20 receives the afore-mentioned MR signal. However, the local coil 20 may be a transmission and reception coil having the function as the transmission coil for transmitting the RF pulse in addition to the function as the reception coil for receiving the MR signal. For example, in the head coil and the knee coil as the local coil 20, there is also the transmission and reception coil. That is, the type of the local coil 20 may be any type of transmission only, reception only, or transmission and reception.

The gradient magnetic field power supply 31 includes the gradient magnetic field power supply devices 31x, 31y, and 31z for each channel for driving each of the coils generating the gradient magnetic fields of the X-axis, the Y-axis, and the Z-axis. The gradient magnetic field power supply devices 31x, 31y, and 31z independently output required current waveforms to each channel in accordance with an instruction of a sequence controller. As a result, the gradient magnetic field coil 11 can apply gradient magnetic fields in the X-axis, Y-axis, and Z-axis directions to the patient U.

The RF transmitter 32 generates an RF pulse signal based on an instruction from the sequence controller 34. The RF transmitter 32 transmits the generated RF pulse signal to the WB coil 12. The detailed configuration of the RF transmitter 32 will be described later with reference to FIG. 2.

The MR signal received by the local coil 20 or more specifically, the MR signal received by each of the coil elements in the local coil 20 is transmitted to the RF receiver 33. An output line of each coil element and an output line of WB coil 12 are called "channel". Therefore, each of the coil elements and each MR signal output from the WB coil 12 may be referred to as a channel signal. The channel signal received by the WB coil 12 is also transmitted to the RF receiver 33.

The RF receiver 33 analog-to-digital (AD)-converts the received channel signal, that is, MR signal, and outputs it to the sequence controller 34. The MR signal which has been changed to a digital one is also called "raw data" in some cases.

The sequence controller 34 images the patient U by driving the gradient magnetic field power supply 31, the RF transmitter 32, and the RF receiver 33, respectively, on the basis of control by the console 400. The sequence controller 34 transmits, when the raw data is received from the RF receiver 33 by imaging, the raw data to the console 400.

The sequence controller 34 includes processing circuitry (not shown). This processing circuitry is constituted by a processor for executing a predetermined program and hardware such as a field programmable gate array (FPGA), an application specific integrated circuit (ASIC) and the like, for example.

The console 400 includes the processing circuitry 40, the memory 41, the display 42, and the input interface 43.

The processing circuitry 40 means any one of dedicated or general central processing unit (CPU) and a micro-processor unit (MPU), an application specific integrated circuit (ASIC), and a programmable logic device. The programmable logic device may be, for example, any one of a simple programmable logic device (SPLD), a complex programmable logic device (CPLD), a field programmable gate array (FPGA) and the like. The processing circuitry 40 reads programs stored in the memory 41 or directly implemented in the processing circuitry 40, and executes these programs to achieve following functions.

The processing circuitry 40 may be a single processing circuit or a combination of multiple processing circuit elements. In the latter case, the memory 41 includes multiple memory elements each storing an element of a program, each of the multiple memory elements is provided for each of the multiple processing circuit elements. Alternatively, the memory 41 includes a single memory storing the program, the single memory is provided for the multiple processing circuit elements.

The memory 41 is made up of semiconductor memory devices such as a random access memory (RAM) and a flash memory, hard discs, optical discs, and the like. The memory 41 may be made up of a portable media such as a universal serial bus (USB) memory and a digital video disk (DVD). The memory 41 stores various processing programs (including application programs, as well as an operating system (OS)) used in the processing circuitry 40, data necessary for executing the programs, and image data. Moreover, the OS may include a graphic user interface (GUI) which frequently uses graphics for displaying information for the operator on the display 42, and allows basic operations to be performed by use of the input interface 43.

The display 42 is a display device such as a liquid crystal display panel, a plasma display panel, and an organic electro luminescence (EL) panel.

The input interface 43 includes an input device which can be operated by the operator, and an input circuit for inputting a signal from the input device. The input device includes a pointing device (for example, a mouse), a keyboard, various buttons, and the like. When the input device is operated by the operator, the input circuit generates a signal corresponding to the operation and outputs it to the processing circuitry 40. It should be noted that the MRI apparatus 1 may include a touch panel in which the input device is integrated with the display 42.

The bed 500 includes a bed body 50 and a table 51. The bed body 50 supports the table 51 to move the table 51, for example, in the X-axis direction, the Y-axis direction, and the Z-axis direction. The movement of the table 51 in the X-axis direction is a movement in a lateral direction of the patient U, that is, in a short-side direction of the table 51. The movement of the table 51 in the Y-axis direction is a movement in a vertical direction of the table 51, that is, in a thickness direction of the table 51. The movement of the table 51 in the Z-axis direction is a movement in a front-rear direction of the table 51, that is, in a longitudinal direction of the table 51. Prior to imaging, the patient U placed on the table 51 is moved in the Y-axis direction up to a predetermined height. Thereafter, the bed body 50 moves the table 51 in the Z-axis direction to move the patient U into the magnet rack 100.

Figure 2:
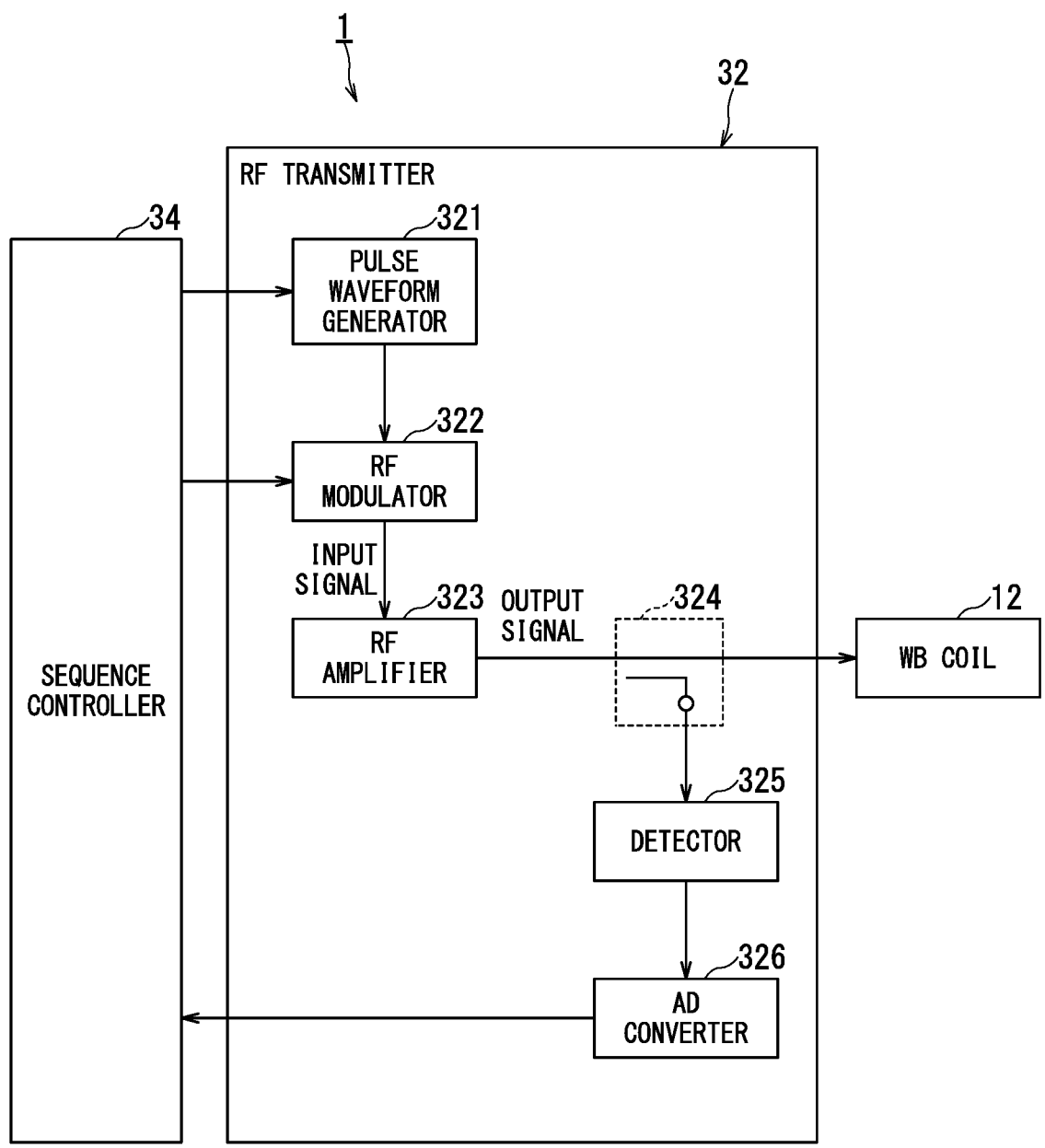
FIG. 2 is a diagram showing a detailed configuration of an RF transmitter provided in the MRI apparatus according to the embodiment.

FIG. 2 is a diagram showing a detailed configuration of the RF transmitter 32 provided in the MRI apparatus 1. FIG. 2 also shows a connection relationship between the RF transmitter 32 and the WB coil 12.

As shown in FIG. 2, the RF transmitter 32 includes a pulse waveform generator 321, an RF modulator 322, an RF amplifier 323, a directional coupler 324, a detector 325, and an analog to digital (AD) converter 326.

The pulse waveform generator 321 generates envelope data under the control of the sequence controller 34.

The RF modulator 322 mixes, under the control of the sequence controller 34, the carrier wave with the envelope data generated by the pulse waveform generator 321, and thereby generating an RF pulse signal having a resonance frequency.

The RF amplifier 323 amplifies the RF pulse signal modulated by the RF modulator 322 and transmits it to the transmission coil, for example, the WB coil 12. The WB coil 12 transmits, in response to the transmitted RF pulse signal, the RF pulse to the patient U (shown in FIG. 1). It should be noted that the one that transmits the RF pulse by the transmission of the RF pulse signal from the RF transmitter 32 is not limited to the WB coil 12, but may be the local coil such as the head coil and the knee coil described above.

The directional coupler 324 is disposed on the transmission line of the RF pulse signal in a non-contact manner on the transmission line. The directional coupler 324 attenuates the RF pulse signal transmitted to the WB coil 12 with a required degree of coupling (coupling coefficient), and transmits it to the detector 325.

The detector 325 detects the output signal of the directional coupler 324.

The AD converter 326 digitally converts the output signal detected by the detector 325. The output data of the AD converter 326 is used as an RF pulse signal to measure a specific absorption rate (SAR), and the output power of the RF amplifier 323 described later.

Figure 3:
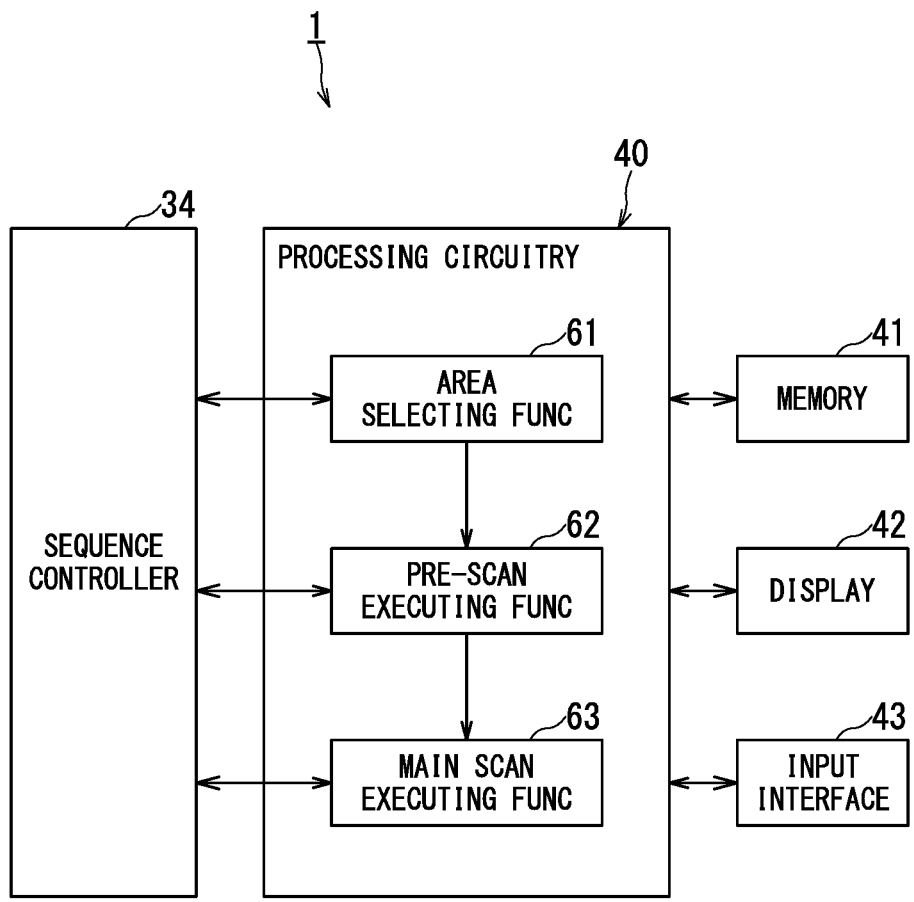
FIG. 3 is a block diagram showing functions of the MRI apparatus according to the embodiment.

FIG. 3 is a block diagram showing functions of the MRI apparatus 1.

The MRI apparatus 1 achieves, by the execution of the program by the processing circuitry 40 of the console 400, an area selecting unit (for example, an area selecting function) 61, a pre-scan executing unit (for example, a pre-scan executing function) 62, a main scan executing unit (for example, main scan executing function) 63. It should be noted that all or part of the functions 61 to 63 may be provided as hardware such as an ASIC in the console 400. All or part of the functions 61 to 63 may be provided not only in the console 400 but also in the sequence controller 34.

The area selecting function 61 includes a function of selecting a specific area within a field of view (FOV) by executing a scan (hereinafter referred to as "region selecting scan") in accordance with a predetermined pulse sequence for selecting the specific area. The selection of the specific area includes at least one of selection (shown in FIGS. 4 and 15 and the like) of the specific area by manual operation of the operator, and selection (shown in FIGS. 8, 10, and 17 and the like) of the specific area by automatically deriving the imaging region and body shape data of the patient U by deriving a specific area.

In this embodiment, the imaging region includes data on a target region. For example, the target region includes a bone or an organ. The organ comprises kidney, liver, blood vessels, nerves or the like. For example, the imaging region "abdomen" includes the target regions "spine", "lumbar vertebra" and the like, and the imaging region "leg" includes the target regions "both knees", "left or right knee", "bone" and the like. The body shape data includes at least height and weight data.

For example, the area selecting function 61 includes a function of acquiring a signal distribution indicating a distribution of the intensities of MR signals corresponding to respective positions in the FOV by executing the region selecting scan, and of selecting, based on the signal distribution, the specific area. The type of the pulse sequence used in the region selecting scan is not particularly limited. For example, a gradient echo based pulse sequence or a spin echo based pulse sequence is used as the type of the pulse sequence used for the region selecting scan.

The pre-scan executing function 62 includes a function of executing a pre-scan according to a pulse sequence for calibrating setting of a main scan, prior to the main scan for acquiring a diagnostic image by the main scan executing function 63 to be described later. The pre-scan executing function 62 includes a function of adjusting the RF level corresponding to only the 90° pulse or both the 90° pulse and the 180° pulse (referred to as "90° pulse or the like" in the present specification). In this case, the pre-scan executing function 62 determines the RF level to be supplied to the transmission coil such as the WB coil 12, based on signals within the specific area selected by the area selecting function 61.

The pre-scan execution function 62 selects, when the specific area is selected by the area selecting function 61 based on the target region included in the imaging region, a region in the FOV as the specific area, the region being a place where the target region is located, and thereby determining the RF level. Alternatively, the pre-scan execution function 62 selects, when the specific area is selected based on the body shape data of the patient U by the area selecting function 61, a region as the specific area, the region being a place where the FOV is limited, and thereby determining the RF level.

The pulse sequence used in the pre-scan is not particularly limited, and the gradient echo based pulse sequence or the spin echo based pulse sequence can be used.

The main scan executing function 63 includes a function of executing a main scan for acquiring a diagnostic image in accordance with an RF level corresponding to the 90° pulse or the like adjusted by the pre-scan executing function 62, and a function of generating the diagnostic image.

It should be noted that a specific description of the functions 61 to 63 of the MRI apparatus 1 will be described later with reference to FIGS. 4 to 19. FIGS. 4 to 13 are for describing the functions 61 to 63 in a case where the imaging region is the abdomen. FIGS. 14 to 19 are for describing the functions 61 to 63 in a case where the imaging region is the legs. The abdomen and legs are representative examples of imaging regions including target regions (for example, spine, knee, etc.) having high signal intensity in their surroundings due to muscle, fat and the like.

FIG. 4 is a flowchart showing an operation of the MRI apparatus 1 in the case where the abdomen is set as the imaging region.

An abdomen of the patient U is placed near the imaging center of the magnet rack 100 (step ST1). The area selecting function 61 sets the abdomen as an imaging region (step ST2). In this embodiment, the area selecting function 61 may set a part designated by the operator via the input interface 43 as the imaging region, in step ST2. The area selecting function 61 may set, when a type of the local coil 20 electrically connected to a port (not shown) provided on the bed body 50 and the table 51 is detected, the imaging region based on the type of the local coil 20 and a type of an approaching direction (Head First or Foot First) of the patient U. When the local coil 20 has multiple coil elements, the imaging region may be set using, in addition to the type of the local coil 20, information indicating a coil element, selected for imaging, of the local coil 20. For example, the area selecting function 61 detects the spine coil as the local coil 20 electrically connected to the port, and sets the spine (the cervical spine, the thoracic vertebra, the lumbar, the sacral, and the tailbone), as the imaging region. For example, the area selecting function 61 detects a coil element electrically connected to a port from multiple coil elements of the spine coil, and sets the lumbar as the imaging region.

The area selecting function 61 executes the specific area scan (step ST3). The area selecting function 61 acquires a signal distribution indicating a distribution of the intensities of MR signals corresponding to respective positions in the FOV including a lumbar area which is the target region, and selects a specific area based on the signal distribution (step ST4). In the case where the imaging region is the abdomen, it is preferable to adopt a sequence in which the Z-axis direction is the slice direction, so that case will be explained, and the slice direction being a direction orthogonal to the frequency encoding direction (that is, the read-out direction) and the phase encoding direction. It is because that the MR signals from the lumbar spine always appear within a certain range on the signal distribution, according to the one-dimensional signal distribution (for example, FIG. 9B) or the two-dimensional signal distribution (for example, FIG. 9A) in the case where the Z-axis direction is the slice direction. It should be noted that even when the imaging region is the abdominal, the present invention is not limited to the case where the Z-axis direction is the slice direction. The slice direction may be selected according to the imaging region.

The significance of the area selecting function 61 selecting the specific area within the FOV in steps ST3 and ST4 will be described.

Each of FIGS. 5A to 5C is a diagram showing the two-dimensional signal distribution in the FOV including the lumbar area in the MRI apparatus 1.

FIGS. 5A and 5B are diagrams showing two-dimensional signal distributions in slices S1 and S2 including the lumbar area in the sagittal image shown in FIG. 5C. In FIGS. 5A and 5B, the upper part shows the belly side and the lower part shows the back side. In FIG. 5C, the left side shows the belly side and the right side shows the back side. As shown in FIGS. 5A and 5B, muscles, fats and the like show high signal intensity, and the lumbar spine and surrounding areas show low signal intensity.

In this embodiment, in the pre-scan, the MRI apparatus 1 is able to determine an RF level corresponding to the 90° pulse or the like based on all the MR signals in the FOV. For example, when the MRI apparatus 1 executes the pre-scan to the abdomen as the imaging region, an RF level corresponding to the 90° pulse or the like is determined based on all MR signals (for example, average value or integrated value in the FOV of the MR signals) in the FOV. However, in this case, even if the MR signal of the lumbar spine as the target region is low, the RF level corresponding to the 90° pulse or the like is determined in accordance with the MR signals of the entire FOV including the lumbar area. That is, when all the MR signals in the FOV are used, the RF signal corresponding to the 90° pulse or the like is not appropriately determined with respect to the lumbar spine as the target region due to the influence of high signal intensity such as muscle and fat.

Therefore, the area selecting function 61 selects a specific area for determining the RF level corresponding to the 90° pulse or the like in the FOV including a lumbar as the target region (steps ST3 and ST4).

Each of FIGS. 6A to 6C is a diagram showing the two-dimensional signal distribution and a specific area in the FOV including the lumbar area in the MRI apparatus 1.

FIGS. 6A and 6B are diagrams showing two-dimensional signal distributions in slices S1 and S2 including the lumbar area in the sagittal image shown in FIG. 6C. The two-dimensional signal distribution of FIG. 6A corresponds to the two-dimensional signal distribution of FIG. 5A, the two-dimensional signal distribution of FIG. 6B corresponds to the two-dimensional signal distribution of FIG. 5B. FIG. 6C is the same as FIG. 5C.

As shown in FIGS. 6A and 6B, the specific area (thick line in the drawing) is arbitrarily selected by the operator so as to include the lumbar area as the target region. The specific area may be determined from body shape data, that is, height and weight included in patient information of the patient U. In this case, a circular, elliptical, or rectangular area obtained from the body shape data with the center at the imaging center (or the center of the slice image) as the center may be determined as the specific area.

If only limited MR signals within the specific area are used, the influence of high signal intensity such as muscle and fat is reduced, so that an RF level corresponding to the 90° pulse or the like is applied to the lumbar spine which is the target region is appropriately determined. The specific area may be selected based on the sagittal image shown in FIG. 6C (thick line).

Returning to the explanation of FIG. 4, the pre-scan executing function 62 executes a pre-scan for calibrating the setting of a main scan, prior to the main scan for acquiring a diagnostic image by the main scan executing function 63 to be described later (step ST5), and adjusts the RF level corresponding to the 90° pulse or the like.

FIG. 7 is a diagram for explaining, by contrast using a graph: a method of determining the RF level corresponding to the 90° pulse based on the MR signal of the entire FOV including the lumbar region; and a method of determining the RF level corresponding to the 90° pulse based on MR signals within the specific area selected in the MRI apparatus 1. FIG. 7, the horizontal axis represents the RF level, that is, the output power of the RF pulse signal outputted from the RF transmitter 32 (shown in FIG. 1), and the vertical axis of FIG. 7 represents intensities of the MR signals emitted from the patient U.

In the conventional pre-scan, in order to determine the RF level corresponding to the 90° pulse, MR signals in the FOV are acquired for each RF level and the average of the MR signals of the entire FOV is calculated. A graph with the distribution of the average value for each RF level is a broken line graph shown in FIG. 7. On the other hand, in the pre-scan of step ST5 (shown in FIG. 4), in order to determine the RF level corresponding to the 90° pulse, MR signals within the specific area are acquired for each RF level and the average of the MR signals within the specific area is calculated. A graph with the distribution of the average value for each RF level is a solid line graph shown in FIG. 7.

As shown in FIG. 7, since the broken line graph is influenced by parts having high MR signal intensities such as muscles and fats, as compared with the solid line graph, the difference between the maximum values M1 and M2 of the respective average MR signal intensities is generated. In the conventional pre-scan, the RF level corresponding to the 90° pulse in imaging the abdomen of the patient U has been determined based on the maximum value M1 of the average signal intensity in the FOV. On the other hand, in the pre-scan of the present embodiment (step ST5 (shown in FIG. 4)), the RF level corresponding to the 90° pulse in imaging the abdomen of the patient U is determined based on the maximum value M2 of the average signal intensity within the specific area. The RF level corresponding to the 180° pulse may be determined similarly to the 90° pulse, and be calculated based on the RF level corresponding to the 90° pulse. For example, the RF level corresponding to the 180° pulse may be four times the RF level corresponding to the 90° pulse.

Returning to the explanation of FIG. 4, the main scan executing function 63 executes a main scan for acquiring a diagnostic image according to the RF level corresponding to the 90° pulse or the like adjusted by the pre-scan executing function 62 (step ST6).

According to the MRI apparatus 1, it is possible to arbitrarily select the appropriate specific area for adjusting the RF level corresponding to the 90° pulse or the like in the step preceding the pre-scan. As a result, the MRI apparatus 1 is able to appropriately determine the RF level corresponding to the 90° pulse or the like corresponding to the lumbar spine, based on the MR signals within the specific area in the pre-scan. A specific example of the operation in step ST4 will be described with reference to FIGS. 8 to 13.

FIG. 8 is a flowchart showing a first specific example of the operation of the MRI apparatus 1 shown in FIG. 4. In FIG. 8, the same steps as those shown in FIG. 4 are denoted by the same reference numerals, and description thereof is omitted.

The region selection function 61 acquires, when the specific area is selected within the FOV including a lumbar (steps ST3 and ST4), the one-dimensional or two-dimensional signal indicating the intensity distribution of the MR signals corresponding to the respective positions in the FOV is acquired (step ST4a). The area selecting function 61 detects the peak of the intensity change of the MR signal from the one-dimensional or two-dimensional signal distribution acquired in step ST4a, and selects the specific area based on the position corresponding to the peak (step ST4b).

FIG. 9A is a diagram showing a two-dimensional signal distribution in the FOV including the lumbar area in the MRI apparatus 1. FIG. 9B is a diagram showing a one-dimensional signal distribution in the FOV including the lumbar area in the MRI apparatus 1. The upper part of FIG. 9B is a one-dimensional signal distribution in which signal intensities on a straight line within the FOV are classified by color (kind of hatching). The lower part of FIG. 9B is a one-dimensional signal distribution showing the signal intensity on a straight line within the FOV as a graph.

It will be explained with reference to FIG. 9B. In step ST3, the area selecting function 61 selects a slice with a predetermined resonance frequency and bandwidth, and acquires the MR signal encoded only in the X-axis direction. That is, in the region selecting scan, the phase encoding amount set in the phase encode direction (Y-axis direction) is fixed to zero, for example, and one-dimensional scan with only the read-out direction (X-axis method) is executed. As a result, the area selecting function 61 is able to acquire MR signals in a short time compared with the case of acquiring MR signals encoded in the X-axis direction and the Y-axis direction (shown in FIG. 9A).

The area selecting function 61 detects two peaks P1 and P2 (preferably having a signal intensity not less than the threshold value) from the one-dimensional signal distribution based on the MR signals, and selects a specific area between an X position corresponding to the peak P1 and an X position corresponding to the peak P2. This is because it is presumed that a lumbar area which is the target region, appears between the X position corresponding to the peak P1 and the X position corresponding to the peak P2. For example, the area selecting function 61 may select the entire area between the X position corresponding to the peak P1 and the X position corresponding to the peak P2 as the specific area. For example, the area selecting function 61 may select a region of 60% as the specific area with the center of the section from the X position corresponding to the peak P1 to the X position corresponding to the peak P2, as a reference. As a result, the specific area restricted in the encoded X-axis direction is selected.

It should be noted that the area selecting function 61 may select the specific area based on the two-dimensional signal distribution shown in FIG. 9A. In this case, the area selecting function 61 selects a slice with a predetermined resonance frequency and bandwidth in step ST3, and acquires MR signals encoded in the X-axis direction and the Y-axis direction. The area selecting function 61 acquires XY positions corresponding to two peaks based on a one-dimensional signal distribution component in the X-axis direction at each Y position in the Y-axis direction in the two-dimensional signal distribution based on the MR signals, and selects a two-dimensional region determined by all the acquired XY positions as the specific area. As a result, the specific area restricted in the encoded X-axis and Y-axis directions is selected.

According to the operation shown in FIG. 8 of the MRI apparatus 1, it is possible to arbitrarily select or automatically derive, based on the peak of the one- or two-dimensional signal distribution, the appropriate specific area for adjusting the RF level corresponding to the 90° pulse or the like in the step preceding the pre-scan. As a result, the MRI apparatus 1 is able to appropriately determine the RF level corresponding to the 90° pulse or the like corresponding to the lumbar spine, based on the MR signals within the specific area in the pre-scan.

FIG. 10 is a flowchart showing a second specific example of the operation of the MRI apparatus 1 shown in FIG. 4. In FIG. 10, the same steps as those shown in FIG. 4 are denoted by the same reference numerals, and description thereof is omitted. When the imaging region is set as the abdomen, MR signals from the arm may show a peak in the signal distribution. In this case, the operation shown in FIG. 10 is more effective than the operation shown in FIG. 8. That is, in the operation shown in FIG. 10, an outline of a body part of the patient U, that is, a body contour is estimated from the signal distribution, and the specific area is selected inside the body contour.

The region selection function 61 acquires, when the specific area is selected within the FOV including a lumbar (steps ST3 and ST4), the one-dimensional or two-dimensional signal indicating the intensity distribution of the MR signals corresponding to the respective positions in the FOV is acquired (step ST4a). The area selecting function 61 detects the peak of the signal intensity of the noise level from the one-dimensional or two-dimensional signal distribution acquired in step ST4a, and selects the specific area based on the position corresponding to the signal intensity (step ST4c).

FIG. 11A is a diagram showing a two-dimensional signal distribution in the FOV including the lumbar area in the MRI apparatus 1. FIG. 11B is a diagram showing a one-dimensional signal distribution in the FOV including the lumbar area in the MRI apparatus 1. The upper part of FIG. 11B is a one-dimensional signal distribution in which signal intensities on a straight line within the FOV are classified by color (kind of hatching). The lower part of FIG. 11B is a one-dimensional signal distribution showing the signal intensity on a straight line within the FOV as a graph.

It will be explained with reference to FIG. 11B. In step ST3, the area selecting function 61 selects a slice with a predetermined resonance frequency and bandwidth, and acquires the MR signal encoded only in the X-axis direction. As a result, the area selecting function 61 is able to acquire MR signals in a short time compared with the case of acquiring MR signals encoded in the X-axis direction and the Y-axis direction (shown in FIG. 11A).

The area selecting function 61 detects X positions of signal intensities P3 and P4 of the noise level from the one-dimensional signal distribution based on the MR signals, as the body contour of the patient U, and selects a specific area between an X position corresponding to the signal intensity P3 of the noise level and an X position corresponding to the signal intensity P4 of the noise level. When the signal intensities equal to or less than the threshold value are continuous, it is desirable that the signal intensity of the X position closest to the center position in the X-axis direction among consecutive signal intensities is set as the body contour. As a result, it is estimated that a lumbar area, which is the target region, appears between the X position corresponding to the signal intensity P3 of the noise level and the X position corresponding to the signal intensity P4 of the noise level. For example, the area selecting function 61 may select the entire area between the X position corresponding to the signal intensity P3 of the noise level and the X position corresponding to the signal intensity P4 of the noise level, as the specific area. For example, the area selecting function 61 may select a region of 60% as the specific area with the center of the section from the X position corresponding to the signal intensity P3 of the noise level to the X position corresponding to the signal intensity P4 of the noise level, as a reference. As a result, the specific area restricted in the encoded X-axis direction is selected.

It should be noted that the area selecting function 61 may select the specific area based on the two-dimensional signal distribution shown in FIG. 11A. In this case, the area selecting function 61 selects a slice with a predetermined resonance frequency and bandwidth in step ST3, and acquires MR signals encoded in the X-axis direction and the Y-axis direction. The area selecting function 61 acquires XY positions corresponding to two signal intensities of the noise level based on a one-dimensional signal distribution component at each Y position in the Y-axis direction in the two-dimensional signal distribution based on the MR signals, and selects a two-dimensional region determined by all the acquired XY positions as the specific area. As a result, the specific area restricted in the encoded X-axis and Y-axis directions is selected.

According to the operation shown in FIG. 10 of the MRI apparatus 1, it is possible to arbitrarily select or automatically derive, based on the position of the noise level of the one- or two-dimensional signal distribution, the appropriate specific area for adjusting the RF level corresponding to the 90° pulse or the like in the step preceding the pre-scan. As a result, the MRI apparatus 1 is able to appropriately determine the RF level corresponding to the 90° pulse or the like corresponding to the lumbar spine, based on the MR signals within the specific area in the pre-scan.

In the explanation of FIGS. 4 to 11, the case where one specific area is selected for one slice has been described, but the present invention is not limited to that case. Multiple specific areas may be selected for one slice, or one or multiple specific areas may be selected for each slice of slices. The case where one specific area is selected for each slice of slices will be described with reference to FIGS. 12 and 13.

FIG. 12 is a flowchart showing a third specific example of the operation of the MRI apparatus 1 shown in FIG. 4. In FIG. 12, the same steps as those shown in FIG. 4 are denoted by the same reference numerals, and description thereof is omitted. Generally, the optimum value of the RF level corresponding to the 90° pulse or the like changes for each position of the slice. Therefore, in the operation of FIG. 12, the optimum value of the RF level corresponding to the 90° pulse or the like is determined for each position of the slice, and at the time of the main scan, the RF level corresponding to the 90° pulse or the like determined in a slice at a position close to an imaging slice is adopted.

The area selecting function 61 executes the specific area scan (step ST3). The area selecting function 61 acquires a signal distribution indicating the distribution of the intensities of the MR signals corresponding to the respective positions in the FOV including the lumbar area which is the target region, and selects a specific area for each slice of slices based on the signal distribution (step ST4d).

FIG. 13 is a diagram showing multiple slices including a lumbar area in the MRI apparatus 1.

FIG. 13 shows multiple of slices S11 to S14 including the lumbar area. For each of the slices S11 to S14, an RF level corresponding to the 90° pulse or the like is determined from the signal distribution in the FOV.

Returning to the explanation of FIG. 12, the pre-scan executing function 62 executes a pre-scan for calibrating the setting of a main scan, prior to the main scan for acquiring a diagnostic image by the main scan executing function 63 to be described later (step ST5d), and adjusts the RF level corresponding to the 90° pulse or the like for each slice.

The main scan executing function 63 executes a main scan for acquiring a diagnostic image according to the RF level corresponding to the 90° pulse or the like adjusted by the pre-scan executing function 62 (step ST6d). The main scan executing function 63 selects, in step ST6d, an RF level corresponding to the 90° pulse or the like, the RF level being determined based on a slice among the slices S11 to S14 (shown in FIG. 13) and the slice being close to a position of the slice acquired by the main scan executing function 63.

According to the operation shown in FIG. 12 of the MRI apparatus 1, it is possible to arbitrarily select or automatically derive, based on the one- or two-dimensional signal distribution, the appropriate multiple specific areas for adjusting the RF level corresponding to the 90° pulse or the like in the step preceding the pre-scan. As a result, the MRI apparatus 1 is able to appropriately determine the RF level corresponding to the 90° pulse or the like corresponding to the lumbar spine, based on the MR signals within each specific area in the pre-scan.

FIG. 14 is a flowchart showing an operation of the MRI apparatus 1 in the case where the leg is set as the imaging region.

Legs of the patient U is placed near the imaging center of the magnet rack 100 (step ST11). The area selecting function 61 sets the legs as an imaging region (step ST12). In this embodiment, the area selecting function 61 may set a part designated by the operator via the input interface 43 as the imaging region, in step ST12. The area selecting function 61 may set, when a type of the local coil 20 electrically connected to a port (not shown) provided on the bed body 50 and the table 51 is detected, the imaging region based on the type of the local coil 20 and a type of an approaching direction of the patient U. For example, the area selecting function 61 detects the knee coil as the local coil 20 electrically connected to the port, and sets the knee as the imaging region.

The area selecting function 61 executes the specific area scan (step ST13). The area selecting function 61 acquires a signal distribution indicating a distribution of the intensities of MR signals corresponding to respective positions in the FOV including a both knees area which is the target region, and selects a specific area based on the signal distribution (step ST14). In the case where the imaging region is the legs, it is preferable to adopt a sequence in which the Z-axis direction is the slice direction, so that case will be explained, the slice direction being a direction orthogonal to the frequency encoding direction and the phase encoding direction. It is because that the MR signals from the both legs always appear within a certain range on the signal distribution, according to the one-dimensional signal distribution (for example, FIG. 18B) or the two-dimensional signal distribution (for example, FIG. 18A) in the case where the Z-axis direction is the slice direction. It should be noted that even when the imaging region is the legs, the present invention is not limited to the case where the Z-axis direction is the slice direction. The slice direction may be selected according to the imaging region.

The significance of the area selecting function 61 selecting the specific area within the FOV in steps ST13 and ST14 will be described.

FIG. 15 is a diagram showing the two-dimensional signal distribution in the FOV including the both legs area in the MRI apparatus 1.

FIG. 15 is a diagram showing two-dimensional signal distributions in a slice including the legs area. In FIG. 15, when an image of a knee (hereinafter referred to as "target knee") in which the knee coil is arranged is executed, an RF level corresponding to the 90° pulse or the like is determined based on all MR signals in the FOV including both knee regions. Therefore, the RF signal corresponding to the 90° pulse or the like with respect to the target knee is not appropriately determined due to the influence of the MR signal emitted from the other knee, between the both knees, and the outside of both knees. In this embodiment, the area selecting function 61 selects a region including a region of the target knee, as the specific area (steps ST13 and ST14).

FIG. 16 is a diagram showing the two-dimensional signal distribution and a specific area in the FOV including the both legs area in the MRI apparatus 1. The two-dimensional signal distribution of FIG. 16 corresponds to the two-dimensional signal distribution of FIG. 15.

As shown in FIG. 16, the specific area (thick line in the drawing) is arbitrarily selected by the operator so as to include the target leg area. The specific area may be determined from body shape data, that is, height and weight included in patient information of the patient U. In this case, a circular, elliptical, or rectangular area obtained from the body shape data with the center at a left point (or right point or both points) as the center from the imaging center (or the center of the slice image), by a certain distance may be determined as the specific area. Further, when the body shape data of the patient information of the patient U includes a leg size and a leg width data, based on the data, a circular, elliptical, or rectangular area with the center at a left point (or right point or both points) as the center from the imaging center (or the center of the slice image), by a certain distance may be determined as the specific area.

If only limited MR signals within the specific area are used, the influence of the other leg or the like is reduced, so that an RF level corresponding to the 90° pulse or the like is applied to the target leg which is the target region is appropriately determined. The specific area may be selected based on the sagittal image (not shown).

Returning to the explanation of FIG. 14, the pre-scan executing function 62 executes a pre-scan for calibrating the setting of a main scan, prior to the main scan for acquiring a diagnostic image by the main scan executing function 63 to be described later (step ST15), and adjusts the RF level corresponding to the 90° pulse or the like.

The main scan executing function 63 executes a main scan for acquiring a diagnostic image according to the RF level corresponding to the 90° pulse or the like adjusted by the pre-scan executing function 62 (step ST16).

According to the MRI apparatus 1, it is possible to arbitrarily select, based on the one- or two-dimensional signal distribution, the appropriate specific area for adjusting the RF level corresponding to the 90° pulse or the like in the step preceding the pre-scan. As a result, the MRI apparatus 1 is able to appropriately determine the RF level corresponding to the 90° pulse or the like corresponding to the target leg, based on the MR signals within the specific area in the pre-scan. An operation example of step ST13 will be described in detail with reference to FIGS. 15 to 19.

FIG. 17 is a flowchart showing a first specific example of the operation of the MRI apparatus 1 shown in FIG. 14. In FIG. 17, the same steps as those shown in FIG. 14 are denoted by the same reference numerals, and description thereof is omitted. In the operation shown in FIG. 17, body contours (outline of both knees) of the patient U is estimated from the signal distribution, and one of the body contours is selected as the specific area.

The region selection function 61 acquires, when the specific area is selected within the FOV including both legs (steps ST13 and ST14), the one-dimensional or two-dimensional signal indicating the intensity distribution of the MR signals corresponding to the respective positions in the FOV is acquired (step ST14a). The area selecting function 61 detects the signal intensities of the noise level from the one-dimensional or two-dimensional signal distribution acquired in step ST14a, and selects the specific area based on the position corresponding to the signal intensities of the noise level (step ST14c).

FIG. 18A is a diagram showing a two-dimensional signal distribution in the FOV including the legs area in the MRI apparatus 1. FIG. 18B is a diagram showing a one-dimensional signal distribution in the FOV including the legs area in the MRI apparatus 1. The upper part of FIG. 18B is a one-dimensional signal distribution in which signal intensities on a straight line within the FOV are classified by color (kind of hatching). The lower part of FIG. 18B is a one-dimensional signal distribution showing the signal intensity on a straight line within the FOV as a graph.

It will be explained with reference to FIG. 18B. In step ST13, the area selecting function 61 selects a slice with a predetermined resonance frequency and bandwidth, and acquires the MR signal encoded only in the X-axis direction. That is, in the region selecting scan, the phase encoding amount set in the phase encode direction (Y-axis direction) is fixed to zero, for example, and one-dimensional scan with only the read-out direction (X-axis method) is executed. As a result, the area selecting function 61 is able to acquire MR signals in a short time compared with the case of acquiring MR signals encoded in the X-axis direction and the Y-axis direction (shown in FIG. 18A).

The area selecting function 61 detects four points P5 to P8 with the signal intensities of the noise level from the one-dimensional signal distribution based on the MR signals, as the body counters of the patient U, and selects a specific area between the two points P5 and P6 or the two point P7 and P8. When the signal intensities below the threshold value are continuous at three positions (a left side, a center side, and a right side in the X-axis direction): for the left side in the X-axis direction, an X position of a signal intensity closest to the center position in the X-axis direction is preferably set as one of the body contours; for the center in the X-axis direction, two X positions of two signal intensities farthest from the center position in the X-axis direction is preferably set as two of the body contours; and for the right side in the X-axis direction, an X position of a signal intensity closest to the center position in the X-axis direction is preferably set as one of the body contours. This is because it is presumed that a target knee area appears between two points on one side. Then, the area selecting function 61 may acquire a representative value (for example, the average value and the maximum value) of the signal intensities between the two points P5 and P6, and a representative value of the signal intensities between the two points P7 and P8 (two points P7 and P8 in the case of FIG. 18B), and select, as a specific area, the whole range corresponding to a larger representative value of values, or 60% of the range. As a result, the specific area restricted in the encoded X-axis direction is selected.

It should be noted that the area selecting function 61 may select the specific area based on the two-dimensional signal distribution shown in FIG. 18A. In this case, the area selecting function 61 selects a slice with a predetermined resonance frequency and bandwidth in step ST13, and acquires MR signals encoded in the X-axis direction and the Y-axis direction. The area selecting function 61 acquires XY positions corresponding to two signal intensities of the noise level based on a one-dimensional signal distribution component at each Y position in the Y-axis direction in the two-dimensional signal distribution based on the MR signals, and selects a two-dimensional region determined by all the acquired XY positions as the specific area. As a result, the specific area restricted in the encoded X-axis and Y-axis directions is selected.

The main scan executing function 63 selects, in step ST16, an RF level corresponding to the 90° pulse or the like corresponding to the FOV position from the RF levels corresponding to the 90° pulse or the like, and the RF levels corresponding to the respective specific areas adjusted by the pre-scan executing function 62. The main scan execution function 63 executes, in step ST16, a main scan for acquiring a diagnostic image and generates the diagnostic image.

According to the operation shown in FIG. 17 of the MRI apparatus 1, it is possible to arbitrarily select or automatically derive, based on the positions corresponding to the signal intensities of the noise level of the one- or two-dimensional signal distribution, the appropriate specific area for adjusting the RF level corresponding to the 90° pulse or the like in the step preceding the pre-scan. As a result, the MRI apparatus 1 is able to appropriately determine the RF level corresponding to the 90° pulse or the like corresponding to the target leg, based on the MR signals within the specific area in the pre-scan.

In the explanation of FIGS. 4 to 18, the case where one specific area is selected for one slice has been described, but the present invention is not limited to that case. Multiple specific areas may be selected for one slice or one or multiple specific areas may be selected for each slice of slices. The case where multiple specific areas are selected for one slice will be described with reference to FIG. 19.

FIG. 19A is a diagram showing a two-dimensional signal distribution in the FOV including the legs area in the MRI apparatus 1. FIG. 19B is a diagram showing a one-dimensional signal distribution in the FOV including the legs area in the MRI apparatus 1. The upper part of FIG. 19B is a one-dimensional signal distribution in which signal intensities on a straight line within the FOV are classified by color (kind of hatching). The lower part of FIG. 19B is a one-dimensional signal distribution showing the signal intensity on a straight line within the FOV as a graph.

In the case where the knee coils are arranged on both knees, respectively, the area selecting function 61 selects a specific area for each of the two target knees, and determines an RF level corresponding to the 90° pulse or the like to each of the two specific areas. As a result, the main scan executing function 63 is able to select, in the main scan, the output power determined in the specific area including the knee to be imaged, of the both knees. In other words, the main scan executing function 63 is able to switch, when imaging both knees one by one, the RF level corresponding to the 90° pulse or the like.

According to the MRI apparatus 1, it is possible to arbitrarily select or automatically derive, based on the positions corresponding to the signal intensities of the noise level of the one- or two-dimensional signal distribution, the appropriate multiple specific areas for adjusting the RF level corresponding to the 90° pulse or the like in the step preceding the pre-scan. As a result, the MRI apparatus 1 is able to appropriately determine the RF level corresponding to the 90° pulse or the like corresponding to each of the target legs, based on the MR signals within the specific area in the pre-scan.

In FIG. 19, an example in which the multiple specific areas which are not overlapped in a slice is determined as an example in the case where the multiple specific areas are selected for one slice, but it is not limited to that case. For example, the area selecting function 61 may determine multiple specific areas having different sizes with the same center in the slice. In this case, the main scan executing function 63 selects an RF level corresponding to the 90° pulse or the like corresponding to the FOV size from multiple RF levels corresponding to the 90° pulses or the like in step ST16, the RF levels corresponding to the respective specific areas adjusted by the pre-scan executing function 62. The main scan execution function 63 executes, in step ST16, a main scan for acquiring a diagnostic image and generates the diagnostic image.

According to at least one embodiment described above, it is possible to appropriately determine the RF level corresponding to the 90° pulse or the like based on the signals of the specific area within the FOV.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a transmission coil configured to apply a high frequency magnetic field to an object; and
processing circuitry configured to
derive a specific area in a field of view (FOV) by analyzing a signal distribution in the FOV, wherein the signal distribution indicates a distribution of intensities of multiple signals corresponding to respective multiple positions in the FOV, and wherein the specific area is derived based on respective peak intensities or threshold intensities of at least two positions of the multiple positions in the FOV, or is derived such that a center of the specific area is a center of the FOV, and
determine, based on a signal within the specific area, an output power level of a high frequency pulse signal supplied to the transmission coil.

2. The magnetic resonance imaging apparatus according to claim 1, wherein
the processing circuitry configured to determine, based on a signal within the specific area, an output power level corresponding to a maximum signal intensity as the output power level of the high frequency pulse signal supplied to the transmission coil.

3. The magnetic resonance imaging apparatus according to claim 1, wherein
the processing circuitry is configured to derive the specific area, based on a one-dimensional signal distribution in which one direction parallel to a cross section of a spinal area is a read-out direction, the one-dimensional signal distribution is the signal distribution within the FOV including the spinal area.

4. The magnetic resonance imaging apparatus according to claim 3, wherein the at least two positions are two positions in the read-out direction corresponding to two peaks in the one-dimensional signal distribution.

5. The magnetic resonance imaging apparatus according to claim 4, wherein
the processing circuitry is configured to determine a range between the two positions in the one-dimensional signal distribution, as the specific area.

6. The magnetic resonance imaging apparatus according to claim 3, wherein the at least two positions are two positions in the read-out direction corresponding to signals of a threshold value or less in the one-dimensional signal distribution.

7. The magnetic resonance imaging apparatus according to claim 6, wherein
the processing circuitry configured to derive all or part of a range between the two positions in the one-dimensional signal distribution, as the specific area.

8. The magnetic resonance imaging apparatus according to claim 1, wherein
the processing circuitry is configured to derive the specific area, based on a one-dimensional signal distribution in which one direction parallel to a cross section of both knee areas is a read-out direction, the one-dimensional signal distribution is the signal distribution within the FOV including the both knee areas.

9. The magnetic resonance imaging apparatus according to claim 8, wherein
the processing circuitry is configured to detect two knee areas, and
wherein the at least two positions are four positions in the read-out direction corresponding to signals of a threshold value or less in the one-dimensional signal distribution such that a region including one of the two knee areas is derived as the specific area.

10. The magnetic resonance imaging apparatus according to claim 8, wherein
the processing circuitry is configured to:
execute an imaging;
derive two specific areas of a slice including respective left and right areas;
determine the output power level for each of the two specific areas; and
select the output power level determined on the specific area including any one of knees acquired by executing the imaging.

11. A magnetic resonance imaging apparatus, comprising:
a transmission coil configured to apply a high frequency magnetic field to an object; and
processing circuitry configured to
derive, based on at least one of an imaging region and the body shape data of the object, a specific area in a field of view (FOV), and
determine, based on a signal within the specific area, an output power level of a high frequency pulse signal supplied to the transmission coil,
derive the specific area in the FOV, based on a signal distribution indicating a distribution of intensities of multiple signals corresponding to respective multiple positions in the FOV, and
derive the specific area, based on a one-dimensional signal distribution in which one direction parallel to a cross section of a spinal area is a read-out direction, the one-dimensional signal distribution is the signal distribution within the FOV including the spinal area.

12. The magnetic resonance imaging apparatus according to claim 11, wherein the processing circuitry is configured to derive the specific area, based on two positions in the read-out direction corresponding to two peaks in the one-dimensional signal distribution.

13. The magnetic resonance imaging apparatus according to claim 12, wherein the processing circuitry is configured to determine a range between the two positions in the one-dimensional signal distribution, as the specific area.

14. The magnetic resonance imaging apparatus according to claim 11, wherein the processing circuitry is configured to derive the specific area, based on two positions in the read-out direction corresponding to signals of a threshold value or less in the one-dimensional signal distribution.

15. The magnetic resonance imaging apparatus according to claim 14, wherein the processing circuitry configured to derive all or part of a range between the two positions in the one-dimensional signal distribution, as the specific area.

16. A magnetic resonance imaging apparatus comprising:
a transmission coil configured to apply a high frequency magnetic field to an object; and
processing circuitry configured to
derive a specific area in a field of view (FOV) by evaluating a signal distribution in the FOV, and
determine, based on a signal within the specific area, an output power level of a high frequency pulse signal supplied to the transmission coil, wherein the processing circuitry is further configured to:
execute an imaging;
derive the specific area for each slice of multiple slices;
determine the output power level for the specific area for each slice of the multiple slices; and
select the output power level determined on the specific area corresponding to a slice closest to a position of a slice of the multiple slices acquired by executing the imaging.

17. A magnetic resonance imaging apparatus comprising:
a transmission coil configured to apply a high frequency magnetic field to an object; and
processing circuitry configured to
derive a specific area in a field of view (FOV) by evaluating a signal distribution in the FOV, and
determine, based on a signal within the specific area, an output power level of a high frequency pulse signal supplied to the transmission coil, wherein
the processing circuitry is configured to:
determine, based on the signal within the specific area, the output power level of the high frequency pulse signal supplied to the transmission coil, the output power level being determined for each of multiple specific areas; and
execute an imaging based on the output power level corresponding to a slice closest to a position of a slice to be imaged.

18. A magnetic resonance imaging apparatus, comprising:
a transmission coil configured to apply a high frequency magnetic field to an object; and
processing circuitry configured to
derive, based on at least one of an imaging region and body shape data of the object, a specific area in a field of view (FOV) for each slice of multiple slices,
determine, based on a signal within the specific area, an output power level of a high frequency pulse signal supplied to the transmission coil, the output power level being determined for each of the multiple specific areas, and execute an imaging based on the output power level corresponding to a slice closest to a position of a slice to be imaged.

* * * * *